(12) United States Patent
Peterson

(10) Patent No.: US 7,494,557 B1
(45) Date of Patent: Feb. 24, 2009

(54) METHOD OF USING SACRIFICIAL MATERIALS FOR FABRICATING INTERNAL CAVITIES IN LAMINATED DIELECTRIC STRUCTURES

(75) Inventor: Kenneth A. Peterson, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 423 days.

(21) Appl. No.: 10/768,329

(22) Filed: Jan. 30, 2004

(51) Int. Cl.
*C03B 29/00* (2006.01)

(52) U.S. Cl. ............ 156/89.11; 156/89.12; 156/89.23; 264/610; 264/43; 264/44

(58) Field of Classification Search ............. 156/89.11, 156/89.12, 89.23; 264/610, 43, 44
See application file for complete search history.

(56) References Cited

U.S. PATENT DOCUMENTS

| | | | | |
|---|---|---|---|---|
| 3,450,546 A | * | 6/1969 | Stong | 501/9 |
| 4,353,957 A | * | 10/1982 | Rutt et al. | 428/110 |
| 4,806,295 A | | 2/1989 | Trickett et al. | |
| 5,176,771 A | | 1/1993 | Bravo et al. | |
| 5,249,355 A | | 10/1993 | Miehls et al. | |
| 5,412,539 A | | 5/1995 | Elwell et al. | |
| 5,468,315 A | * | 11/1995 | Okada et al. | 156/64 |
| 5,538,789 A | * | 7/1996 | Capote et al. | 428/344 |
| 5,575,872 A | * | 11/1996 | Tsukada et al. | 156/89.15 |
| 5,601,673 A | | 2/1997 | Alexander | |
| 5,683,535 A | | 11/1997 | Karr | |
| 5,779,833 A | | 7/1998 | Cawley et al. | |
| 6,527,890 B1 | * | 3/2003 | Huang et al. | 156/89.11 |
| 6,572,830 B1 | | 6/2003 | Burdon et al. | |
| 6,586,885 B2 | | 7/2003 | Coll et al. | |
| 6,592,696 B1 | | 7/2003 | Burdon et al. | |

OTHER PUBLICATIONS

K. Peterson, et al; Novel Structures in Ceramic Interconnect Technology; Conf: Ceramic Interconnect Technology: The Next Generation, Denver, CO; Proceedings of SPIE—The International Society for Optical Engineering, 2003, v. 5231, p. 223-228.
Homi C. Bhedwar, et al; Ceramic Multilayer Package Fabrication; Electronic Material Handbook.
Harmonics@hmnx.com; High Purity Carbon Tape; 2003 Harmonics, Inc.
H. Adluru, et al., "Embedded Heat Exchanger in LTCC Substrate", Conference: Ceramic Interconnect Technology: The Next Generation, Denver, CO; Proceedings of SPIE—he International Society for Optical Engineering, 2003, v. 5231, p. 205-210.
K. Walsh, et al., "Photoresist as a sacrificial layer by dissolution in acetone" 14th IEEE International Conference on Micro Electro Mechanical Systems, Jan. 21-25, 2001, Interlaken, Switzerland; Proceedings of the IEEE Micro Electtro Mechanical Systems (MEMS); 2001; p. 114-117.
Overview of low temperature co-fired ceramic tape technology . . . , M.R. Gongora-Rubio et al., Sensors and Actuators A 89 (2001) pp. 222-241.

* cited by examiner

*Primary Examiner*—John L Goff
(74) *Attorney, Agent, or Firm*—Robert D. Watson

(57) ABSTRACT

A method of using sacrificial materials for fabricating internal cavities and channels in laminated dielectric structures, which can be used as dielectric substrates and package mounts for microelectronic and microfluidic devices. A sacrificial mandrel is placed in-between two or more sheets of a deformable dielectric material (e.g., unfired LTCC glass/ceramic dielectric), wherein the sacrificial mandrel is not inserted into a cutout made in any of the sheets. The stack of sheets is laminated together, which deforms the sheet or sheets around the sacrificial mandrel. After lamination, the mandrel is removed, (e.g., during LTCC burnout), thereby creating a hollow internal cavity in the monolithic ceramic structure.

32 Claims, 26 Drawing Sheets

Step 1 - Collation

Cutout

Step 2 - Lamination

Step 3 - Burnout

Collapsed Cavity

Step 4 - Firing

Collapsed Cavity

Step 1 - Collation

Matching Insert

Cutout

Step 2 - Lamination

Step 3 - Burnout

Step 4 - Firing

Cavity 1 mm

METHOD OF USING SACRIFICIAL MATERIALS FOR FABRICATING INTERNAL CAVITIES IN LAMINATED DIELECTRIC STRUCTURES

FEDERALLY SPONSORED RESEARCH

The United States Government has rights in this invention pursuant to Department of Energy Contract No. DE-AC04-94AL85000 with Sandia Corporation.

CROSS-REFERENCE TO RELATED APPLICATIONS

None

BACKGROUND OF THE INVENTION

The present invention relates generally to a method of using sacrificial materials for fabricating internal cavities and channels in laminated dielectric structures, which can be used as dielectric substrates and package mounts for microelectronic and microfluidic devices.

Multilayered, laminated dielectric structures are commonly used in microelectronic and microfluidic devices for substrates and package mounts. Multilayered dielectric materials include printed wiring board (PWB) laminate materials, low-temperature co-fired glass/ceramic dielectric materials (LTCC) and high-temperature co-fired ceramic/glass (HTCC) materials.

For storing and operating microelectronic devices in severe environments, ceramic packages are preferred because they are generally stronger and more hermetic than plastic encapsulated packages. These packages are typically made by laminating multiple layers of unfired glass/ceramic sheets. Individual layers of unfired glass/ceramic dielectric material (i.e., green ceramic) are created by casting a blend of ceramic and glass powders, organic binders, plasticizers, and solvents into sheets or tapes (e.g., tape casting). The organic components provide strength and flexibility to the green/unfired sheets/tapes during handling. The tape-cast sheets (i.e., "green tape") are then personalized by cutting out individual sheets having the appropriate outside perimeter and internal apertures (if needed). This can be done by punching, water-jet cutting, laser cutting, conventional machining, etc. Lines or traces of conductive metallized pastes or inks can then be deposited on individual sheets by using a thick-film screen-printing process, MicroPen™ direct-write printing, etc. Thick-film resistors can also be deposited at this stage. Transverse vias can be machined into selected sheets by punching, drilling, or laser ablation. The vias are then filled with a conductive paste by screen-printing, which allow conductive traces on one level to be electrically connected to conductive traces on another level. The individual sheets are then collated, stacked, and laminated. Optionally, an adhesive or solvent may be applied to the individual sheets prior to lamination. Then, the stack is then vacuum bagged and isostatically compressed at high pressure (e.g., 3000 psi) and moderate temperatures (e.g., 60-80 C) until the individual sheets adhere to form a laminated assembly. Uniaxial pressing, with pressures as high as 30,000 psi, can also be used.

Next, the laminated assembly is baked at relatively low temperatures (e.g. 350-450° C.), to remove organic binders and plasticizers from each layer and from conductor/resistor pastes. After this "burnout" step has been completed, the assembly is fired at much higher temperatures (e.g., 850 C for LTCC, up to 1650 C for HTCC), which sinters and densifies the glass-ceramic substrate to form a dense, rigid, monolithic ceramic structure. During firing, glass-forming constituents in the layers flow and advantageously fill-in voids, corners, etc. Because all of the individual sheets of tape-cast ceramic material (including patterned lines of conductive pastes (Au, Ag) and filled vias) are baked and fired simultaneously, the product made by this process is conventionally designated as a co-fired ceramic dielectric material.

Two different co-fired ceramic multilayer systems are commonly used, depending on the choice of materials and processing temperatures: high-temperature co-fired ceramic (HTCC), and low-temperature co-fired ceramic (LTCC). When the ratio of ceramic-to-glass is high (e.g., 9-to-1, or greater), the green tape can only be sintered (e.g. densified) at very high firing temperatures (e.g. 1300 to 1800 C). Accordingly, thick-film conductive pastes for HTCC systems comprise high-melting point metals, such as tungsten, or alloys of molybdenum and manganese. The dielectric consists of glass fillers in a ceramic matrix. During firing a glassy phase is formed from the presence of various oxides in the ceramic.

Alternatively, in the LTCC system, the dielectric can comprise a ceramic-filled glass matrix, which is typically sintered at much lower firing temperatures (e.g. 600 to 1300 C, typically around 850 C). Thick-film metallization can use high-conductivity metals, such as gold, silver, copper, silver-palladium, and platinum-gold.

Hereinafter, when the term "LTCC" is used, it is intended to also include the HTCC material system, unless specifically stated otherwise.

Internal cavities, recessed volumes, microchannels, etc. are used in microelectronic and microfluidic devices to provide spaces for mounting Integrated Circuit (IC's) or other discrete devices, and/or for providing means for conveying and/or storing a liquid or gas within the device or from one location to another. These internal "cavities" are conventionally fabricated by cutting out a volume of material from a specific layer inside the stack of layers, thereby making an aperture, as shown in FIG. 1. However, if the dimension of the cutout is much wider than it is tall, then during the lamination step the internal cavity walls above and below the cutout can sag or even collapse when high pressures are applied.

To solve this problem, the conventional approach is to use a temporary insert (made of a different material) placed inside of the cutout volume, as shown in FIG. 2. The temporary insert is sized to closely match the shape of the cutout volume and thickness of the layer (i.e., $2^{nd}$ layer in FIG. 2), to provide adequate support against collapse of the internal cavity walls during lamination.

In U.S. Pat. No. 5,601,673, "Method of Making Ceramic Article with Cavity Using LTCC Tape", Alexander teaches that it is important that the temporary insert have the same thickness as the ceramic tape layers to assure good dimensional control.

In the case where the temporary insert can not be simply picked or pulled out after the final firing step, then other methods must be used to remove the insert. Alexander (ibid) teaches that the insert can be made of a "fugitive" or sacrificial material that "burns out" and disappears during the burnout/firing step. Examples of fugitive materials taught by Alexander include: (1) the same materials as the binder/plasticizer system used in the green LTCC dielectric tape, and (2) a dough-like material comprising cornstarch, petroleum jelly, and a small amount of plasticizer. As illustrated in FIG. 3 of the instant application, the fugitive insert (sacrificial material) supports the neighboring cavity walls during lamination. Then, the sacrificial material burns out during the burnout step. Finally, the structure is fired to densify the ceramic, leaving an internal cavity that has not sagged or collapsed.

In U.S. Pat. No. 5,779,833, "Method for Constructing Three Dimensional Bodies from Laminations", Cawley et al. disclose the use of fugitive materials for providing temporary support of internal cavities, where the thickness of the fugitive layers is chosen to allow the forming of a flat surface coplanar with the surface of the subassembly after each layer is stacked. Examples of fugitive materials taught by Cawley et al. include: (1) acrylic latex in a colloidal suspension; (2) walnut flour made by grinding walnut shells and organic gels; (3) corn starch suspended in an aqueous slurry or suspended in toluene or polyvinyl butyrate; and (4) inorganic oxide ceramic powders greater than 3 micron diameter held in a polymer binder, which turns into a flowable powder after the binder has been burned away.

In U.S. Pat. No. 4,806,295, "Ceramic Monolithic Structure Having an Internal Cavity Contained Therein and a Method of Preparing the Same", Trickett et al. teach the use of low-melting point paraffin wax or Woods metal to provide temporary support of internal cavity walls during the lamination step. After isostatic pressing, the laminated structure is placed in a suitable position and heated to allow the melted supporting media to "drain away" from the structure.

Alternatively, photoresist has been used to define internal channels. The temporary photoresist material is removed by exposing the photoresist to acetone, which dissolves the photoresist, and allows it to flow out of the channels.

The conventional method of using a temporary, matching insert to provide cavity support, as illustrated in FIGS. 2 and 3, has a number of problems and disadvantages. First, a cutout has to be made in the layer. Then, a closely matching insert has to be fabricated and inserted into the cutout. All of these steps require additional time and costs. When the internal cavity comprises complex-shapes or multiple-curved channels (e.g., serpentine channels), then the steps of making the cutout and fabricating a matching insert become even more expensive and time-consuming. At some level of complexity (of the cutout pattern), the costs of using complex shaped inserts is prohibitive.

What is needed, therefore, is an easier and less expensive method for fabricating internal cavities in multilayered dielectric structures; preferably that doesn't require the use of cutouts and matching inserts. Preferably, the improved method would be self-aligning and self-assembling.

Against this background, the present invention was developed.

SUMMARY OF THE INVENTION

The present invention relates to a method of using sacrificial materials for fabricating internal cavities and channels in laminated dielectric structures, which can be used as dielectric substrates and package mounts for microelectronic and microfluidic devices. A sacrificial mandrel is placed in-between two or more sheets of a deformable dielectric material (e.g., unfired LTCC glass/ceramic dielectric), wherein the sacrificial mandrel is not inserted into a cutout made in any of the sheets. The stack of sheets is laminated together, which deforms the sheet or sheets around the sacrificial mandrel. After lamination, the mandrel is removed, (e.g., during LTCC burnout), thereby creating a hollow internal cavity in the monolithic ceramic structure.

BRIEF DESCRIPTION OF THE DRAWINGS

The accompanying drawings, which are incorporated in and form part of the specification, illustrate various examples of the present invention and, together with the detailed description, serve to explain the principles of the invention.

DETAILED DESCRIPTION OF THE INVENTION

Hereinafter, when the term "LTCC" is used, it defined to include the HTCC material system, unless specifically stated otherwise. The term "green tape" is herein used interchangeably with "unfired ceramic". The term "green tape" is defined to include "green sheets". The word "cavity" is defined to include channels, microchannels, capillaries, conduits, wells, internal volumes, blind volumes, passageways, manifolds, and grooves. The terms "fugitive insert", "sacrificial mandrel", and "sacrificial volumes" are all used interchangeably to refer to a piece of sacrificial material that is subsequently removed from the finished structure after being used to define an internal cavity.

Figure 4:
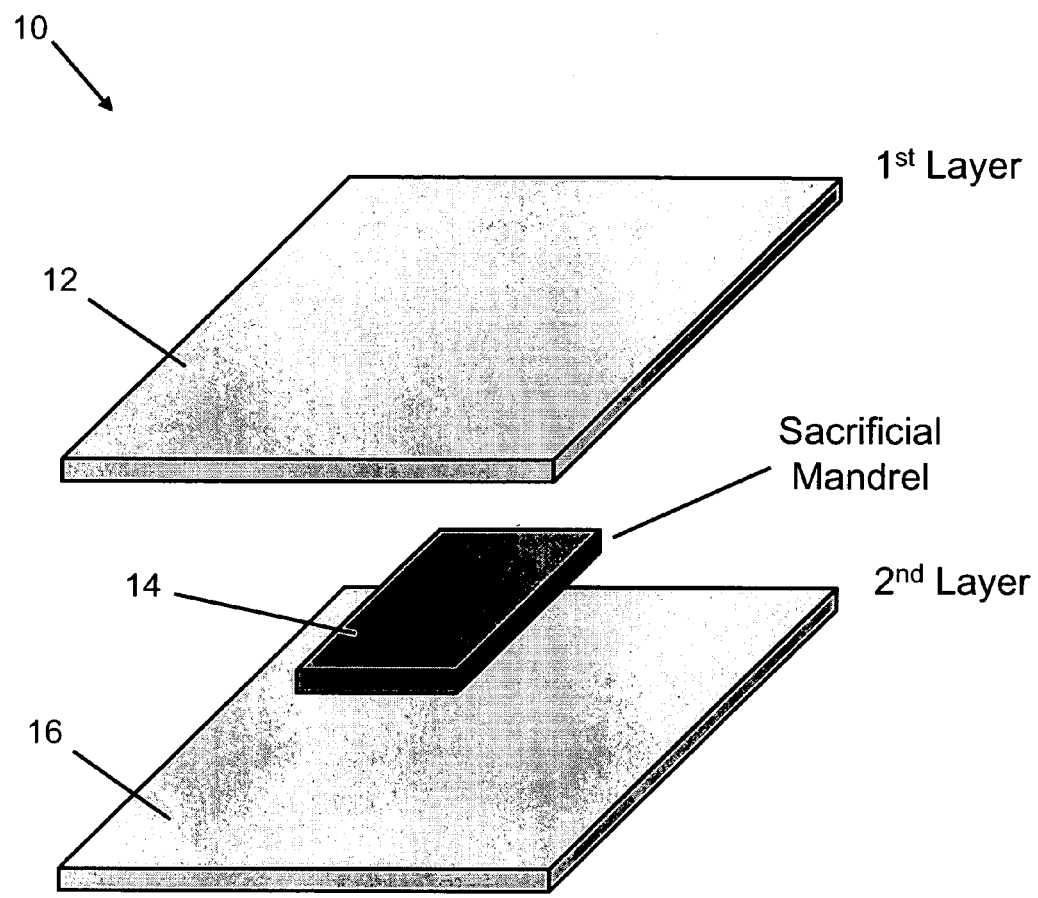
FIG. 4 shows an isometric view of a sacrificial mandrel disposed in-between two layers of deformable dielectric material, according to the present invention.

FIG. 4 shows an isometric view of a sacrificial mandrel disposed in-between two layers of deformable dielectric material, according to the present invention. First layer 12 and second layer 16 comprise a deformable dielectric material, which may be the same or different material. Examples of deformable dielectric materials include unfired LTCC or HTCC green-tape, and printed wiring board material (e.g., epoxy resin impregnated woven glass fiber cloth, FR4, fiber reinforced polyimide, etc.), and polymers in general. Sacrificial mandrel 14 is disposed in-between layers 12 and 16, and is made of a sacrificial material. There are no pre-existing cutouts or pre-manufactured channels in layers 12 or 16 (as contrasted to the $2^{nd}$ layer in prior art FIG. 2, which does has a cutout). Typical thicknesses for LTCC green-tape material is 10 mil (1 mil=0.001 inches), but the thickness may be as thin as 4 mil or 2 mil. A commonly used LTCC green tape is DuPont 941 Green Tape™ and DuPont 943 Low Loss Green Tape™.

Figure 5A:
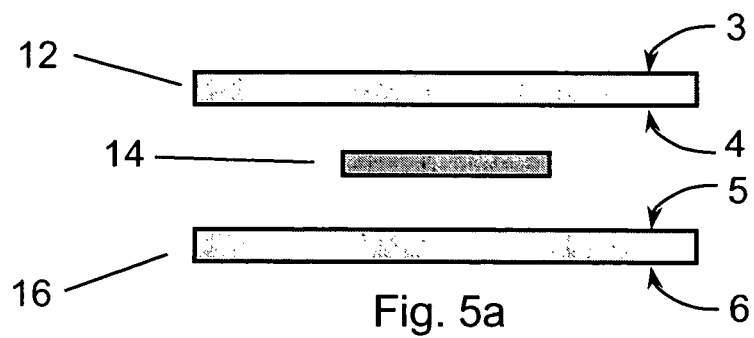
FIGS. 5a-5d show a cross-sectional end view of a multi-layered dielectric structure with an internal cavity, illustrating the method of fabrication, according to the present invention.
Figure 5B:
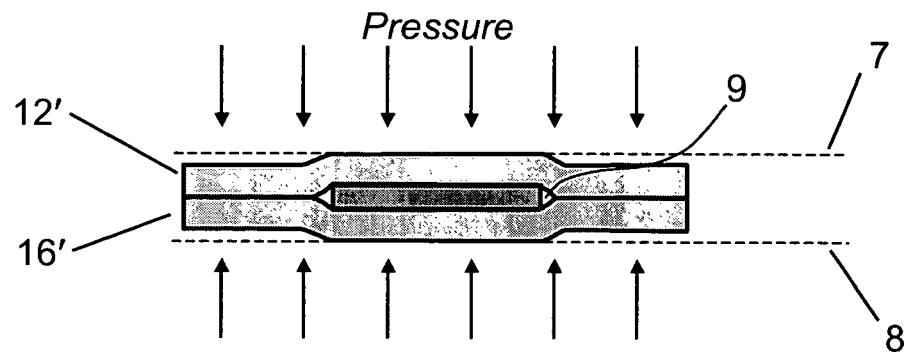

FIGS. 5a-5d show a cross-sectional end view of a multi-layered dielectric structure with an internal cavity, illustrating the method of fabrication, according to the present invention. In FIG. 5a, sacrificial mandrel 14 is placed in-between upper and lower deformable dielectric layers 12, 16. Upper layer 12 has upper and lower surfaces 3 and 4, respectively, while lower layer 16 has upper and lower surfaces 5 and 6, respectively. Next, in FIG. 5b, the layers/sheets are collated, stacked and laminated. Sufficient pressure is applied to the outside surfaces 3 and 6, respectively, of the upper and lower layers 12, 16 to permanently deform the two layers around sacrificial mandrel 14. The deformed layers 12', 16' substantially conform to the outer surface of mandrel 14, substantially encapsulating mandrel 14. Sufficient pressure is applied to also make the inside surfaces 4 and 5, respectively of the two deformed layers 12', 16' contact and adhere to each other on either side of mandrel 14. Dashed lines 7 and 8 indicate the original, un-deformed outer surfaces 3 and 6 of the two layers 12, 16 prior to lamination. Depending on how much pressure is applied, the temperature, and flow characteristics of the deformable layers 12, 16, a small open gap 9 may exist on one or both sides of mandrel 14. For typical unfired ceramic green-tape layers 12, 16, the stacked layers are vacuum bagged and hydrostatically compressed at pressures as high as 3000 psi, and temperatures in the range of 60-80 C. If a gap 9 is likely to occur, then it could be eliminated by applying higher pressures and/or at higher temperatures. Lamination temperatures could be increased to beyond 100 C if the water in the isostatic pressing device would be replaced with a higher boiling point liquid (e.g., hydraulic oil, etc.). Higher lamination temperatures would also soften the unfired ceramic green-tape layers 12, 16 and allow them to flow more easily, thereby reducing or eliminating the size of gap 9.

Figure 5C:
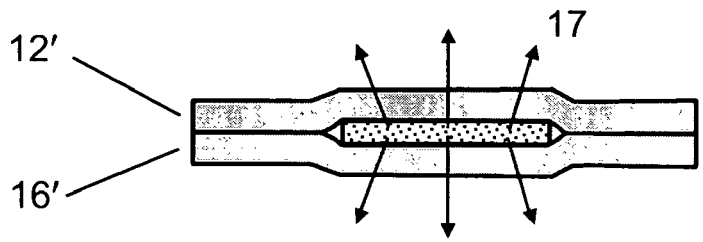

Next, in FIG. 5c the laminated stack is heated to temperatures sufficient to burnout and remove organic components from both the green-tape layers 12, 16, and from the sacrificial mandrel 14. For typical LTCC systems, this burnout temperature is in the range of 300-500 C, with 450 C being commonly used. At these temperatures, organic components in the green tape (binders, plasticizers, etc.), such as poly (vinyl butyrals or alcohols), polylactones, copolymers of lower alkyl acrylates, and methacrylates are cleanly burned out in an oxidizing atmosphere. Burnout of the sacrificial mandrel 14 generates gases 17 that permeate through the porous layers 12' and 16'. Additionally, or alternatively, gases 17 may directly vent out through any openings that communicate with the outside. Under proper burnout conditions, substantially all of the sacrificial mandrel 14 will disappear from inside of the structure 20, leaving behind a hollow, internal cavity 18 with little or no organic residue (see FIG. 5d).

Figure 5D:
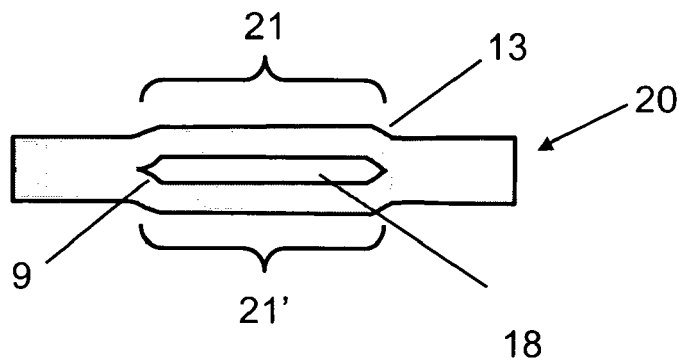

Next, in FIG. 5d, after burnout has been completed, the ceramic structure 20 is fired at a higher temperature, e.g., 850 C, to sinter and fully densify the laminated layers into a dense, monolithic ceramic structure 20. Distinguishing features of ceramic structure 20 include a raised bump or protruding line 21, 21' located directly above and below the internal cavity 18, respectively, as well as a curved or rounded shoulder or ramp 13 at the edges of the protruding feature 21.

Typically, the burnout step is performed in an oxidizing atmosphere (e.g., air), in order to burnout the organic constituents. However, the subsequent step of sintering the ceramic structure (after burnout) may be optionally performed in a vacuum. For an internal cavity that is a blind volume (i.e., that doesn't have any connections or openings to the outside), then the cavity should have a vacuum trapped inside of it after the structure has cooled down from sintering.

Figure 5E:
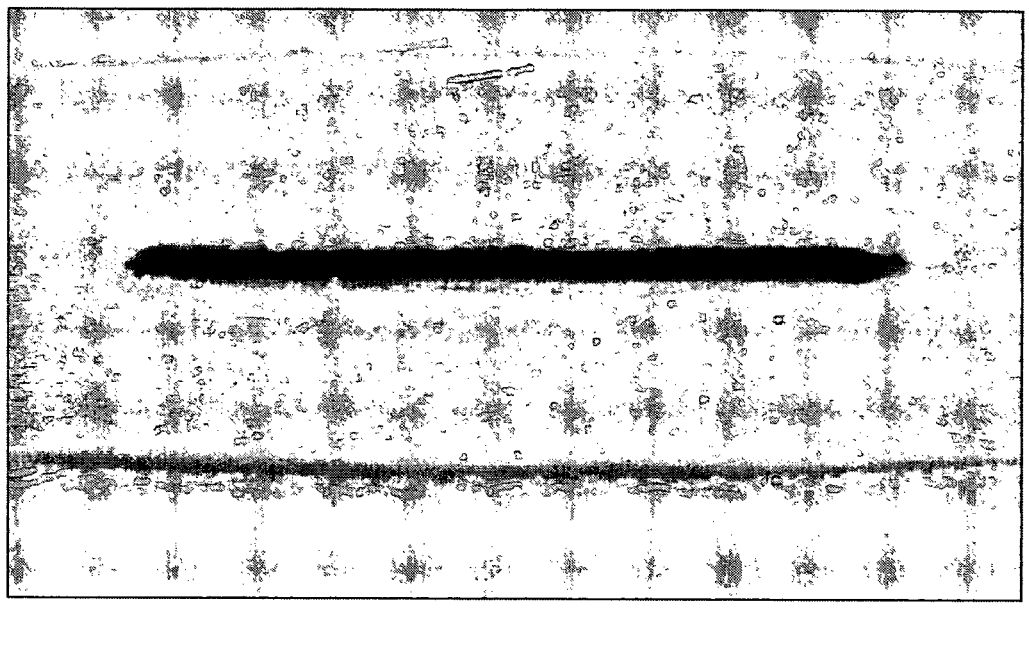
FIG. 5e shows a cross-section photograph of a ceramic structure manufactured according to the method described in FIGS. 5a-5d.
Figure 5E:

FIG. 5e shows a cross-section photograph of a ceramic structure manufactured according to the method described in FIGS. 5a-5d. The sacrificial mandrel is a strip of sacrificial material (polypropylene), 0.1 mm thick by 2 mm wide. It was placed in-between 2 sheets of LTCC green tape (0.3 mm thick) on the bottom and 2 sheets of the same LTCC green-tape on top. The stacked layers were then vacuum-bagged and hydrostatically pressed at 3000 psi at 70 C. Then, the laminated green assembly was baked and fired in a single air furnace run, with a hold at 450 C for burning out organic components, and then a hold at the highest temperature, 850 C, for sintering, followed by cool-down to room temperature. Notice that the two inside sheets of LTCC have completely deformed around the sacrificial mandrel, leaving no gap on either side of the mandrel. Notice also that the cavity walls are relatively smooth and flat, with no obvious residue of the sacrificial material. Significantly, the cavity walls have not sagged or collapsed, thereby demonstrating that the sacrificial mandrel has successfully performed its function of supporting the adjacent layers surrounding the cavity during lamination.

With reference back to FIG. 4 (and to FIGS. 5a-5d), it should be noted that the sacrificial mandrel 14 in FIG. 4 does not extend out to the outer edges of layers 12 and 16. Therefore, when the lamination, burnout, and firing steps have been completed, the disappearance of mandrel 14 creates an internal cavity 18 that is a closed volume, meaning that has no connections to the outside world. In this sense, the closed volume created by the removal of mandrel 14 is a "blind volume" (i.e., since it doesn't "see" the outside).

Some examples of suitable sacrificial materials include, by are not limited to: wax, a low melting point metal or metal alloy, Woods metal, carbon, graphite, carbon tape, carbon-filled slurry, porous graphite, a plasticizer, an organic binder, plastic, a water-soluble material, starch, sugar, corn starch, a material soluble in an organic solvent, photoresist, an acrylic latex in a colloidal suspension, walnut flour made by grinding walnut shells and organic gels, inorganic oxide ceramic powders greater than 3 micron diameter held in a polymer binder, polypropylene, a photo-patternable material, LTCC or HTCC ceramic green-tape dielectric material made without any ceramic or glass fillers, and a low molecular weight polymer.

In the present invention, the step of removing the sacrificial mandrel may comprise one or more actions selected from the group consisting of heating, baking, firing, evaporating, sublimating, pyrolysis, disassociation, burning, oxidizing, reducing, dissolving, melting, powdering, pouring out, picking out, and pulling out.

Additionally, the step of placing the sacrificial mandrel in-between the first and second sheets may comprise one or more actions selected from the group consisting of making and placing a patterned sheet of sacrificial material, depositing sacrificial material directly on to one or more of the sheets, stamping, and masking and etching. In particular, the step of making a patterned sheet of sacrificial material may comprise performing one or more actions on a sheet of sacrificial material selected from the group consisting of laser cutting, blade cutting, water-jet cutting, punching, and masking and etching.

Additionally, the step of depositing sacrificial material may comprise performing one or more actions selected from the group consisting of screen printing a liquid or paste, stenciling, direct micropen writing, and spinning-on a photo-patternable liquid followed by masking and exposing and developing the pattern. Additionally, the sacrificial mandrel may have a geometric shape selected from the group consisting of a flat sheet, a curved sheet, a solid cylinder, a tube, a wire, a disk, a straight line, a curved line, a serpentine line, and a wet-deposited line on a substrate having a partially flattened, spread-out drop-like cross-sectional shape. Mandrel could be round with strip of sacrificial material coiling in like a seashell).

Figure 6A:
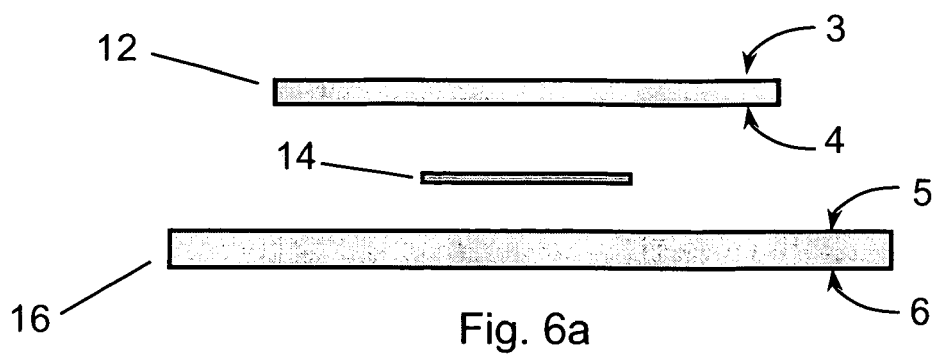
FIGS. 6a-6d shows a cross-sectional view of another example of method steps for fabricating a ceramic structure, according to the present invention.
Figure 6B:
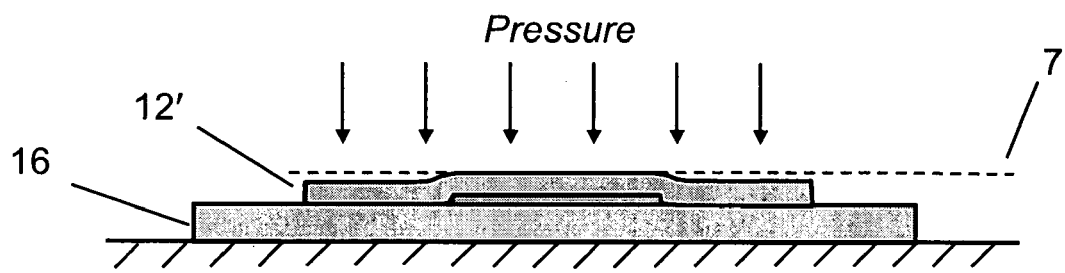

FIGS. 6a-6b shows a cross-sectional view of another example of method steps for fabricating a ceramic structure, according to the present invention. In FIG. 6a, the deformable layer 12 and sacrificial mandrel 14 are provided. In this example, the bottom layer 16 does not have to be made of a deformable dielectric material, but it can be. Also, the thicknesses of the three layers 12, 14, 16 do not have to be the same as each other, nor does the width of the upper layer 12 have to be the same as the width of the bottom layer 16. In this example, the thickness of mandrel 14 is less than the thickness of upper layer 12; and mandrel 14 is much wider than it is thick (like a tape).

Next, in FIG. 6b, the layers are collated, stacked and laminated at high pressure, as described earlier. In this case, however, bottom layer 16 supported by a rigid surface (e.g., a thick steel plate, not shown) and not allowed to deform or bend during lamination. Hence, only the top layer 12' deforms down onto the bottom layer 16. Permanently deformed layer 12' substantially surrounds and encases sacrificial mandrel 14.

Figure 6C:
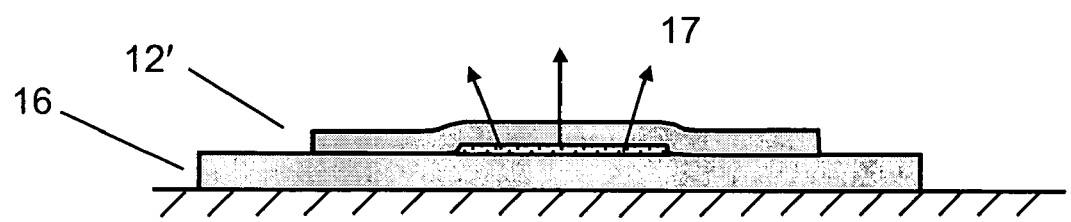
Figure 6D:
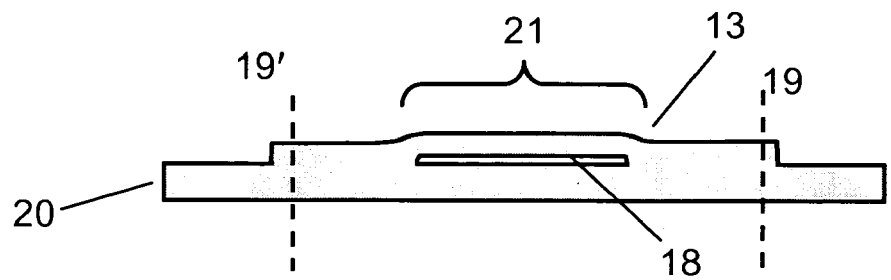

Next, in FIG. 6c, the organic constituents from both the sacrificial mandrel 14 and the unfired ceramic layers 12' and 16 are burned out and removed, leaving behind hollow internal cavity 18. Finally, in FIG. 6d, the burnt-out structure 20 is fired at high temperatures to sinter and densify the ceramic into a monolithic structure 20. Structure 20 comprises a protruding bump or region 21 located above cavity 18, with rounded shoulder 13. In this example, bump 21 exists only on one side (i.e., the upper side), since the lower surface was constrained to be flat during the lamination step. The height of the raised bump 21 corresponds roughly to the height of the sacrificial mandrel 14. Also shown in FIG. 6d are optional cutting lines 19 and 19', which indicate that the edges of the fired structure 20 can be easily trimmed to a desired width after firing. This possibility allows the initial stackup of layers 12, 14 and 16 in the first step (see FIG. 6a) to be unaligned, since they can be subsequently trimmed to a specific desired width. In this respect, the method of the present invention is a self-aligning and self-assembling process; meaning that the upper layer 12 does not have to be precisely aligned with the lower layer 16 (since the internal cavity is naturally determined by the position of the sacrificial mandrel 14) and that there is no strict requirement for the outer edges of the individual layers to line up with each other (since they can be trimmed later).

Figure 1:
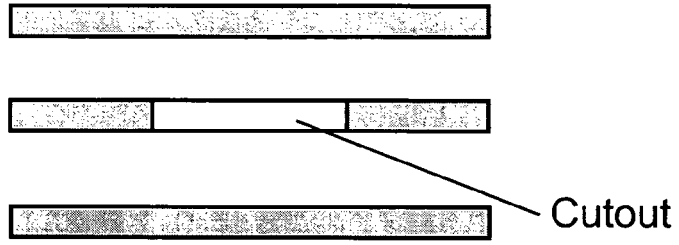
FIG. 1 shows a cross-sectional view of an example of a prior art method.
Figure 1:
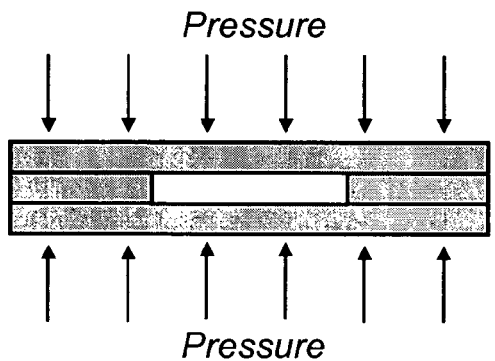
Figure 1:
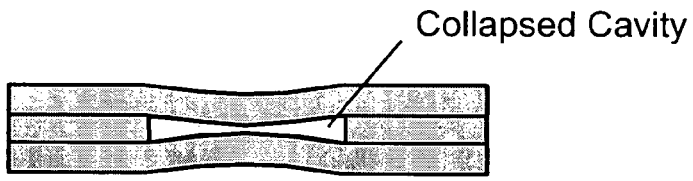
Figure 1:
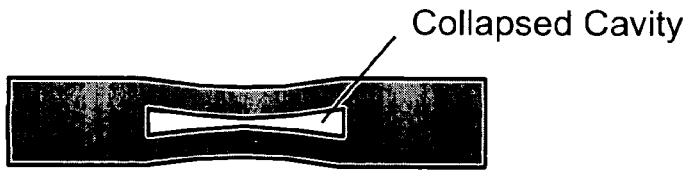
Figure 2:
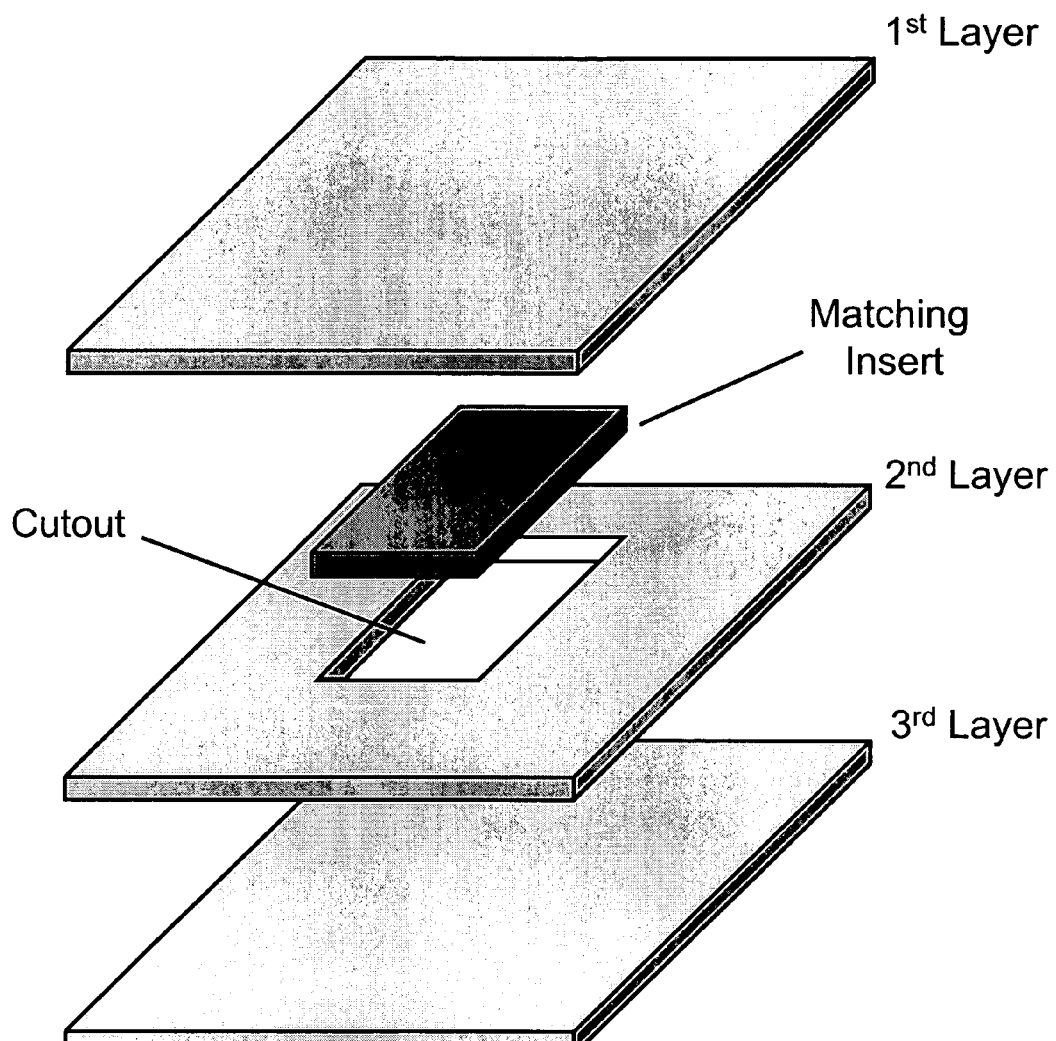
FIG. 2 shows an isometric view of an example of a prior art method.
Figure 3:
FIG. 3 shows a cross-sectional view of an example of a prior art method.
Figure 3:
Figure 3:
Figure 3:
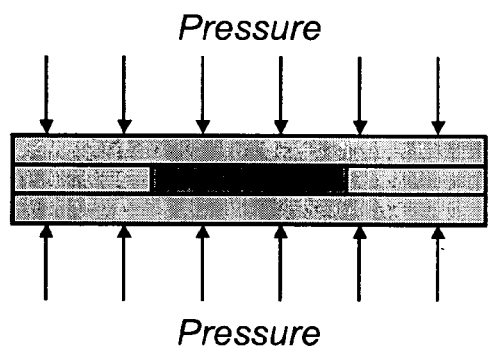
Figure 3:
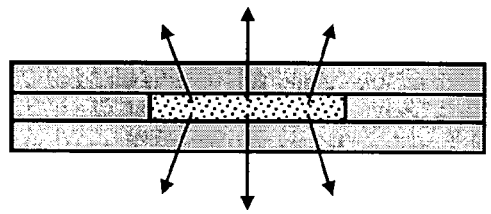
Figure 3:
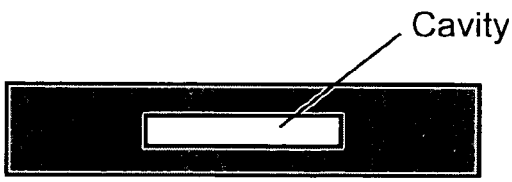

It is important to distinguish between the uses of a sacrificial mandrel 14 in the present invention (see, e.g., FIGS. 4-6) with the use of a temporary insert (see, e.g., FIGS. 2 and 3 from the prior art). In the present invention, sacrificial mandrel 14 is not inserted into any pre-existing channels, cutouts, or cavities; unlike the prior art, where the temporary insert is pre-placed into pre-existing cutouts, channels, or cavities before laminating. In other words, in the present invention internal cavity 18 is created naturally during the lamination step when the surrounding layers of deformable material are pressure-formed or "coined" around the sacrificial mandrel 14.

Figure 7A:
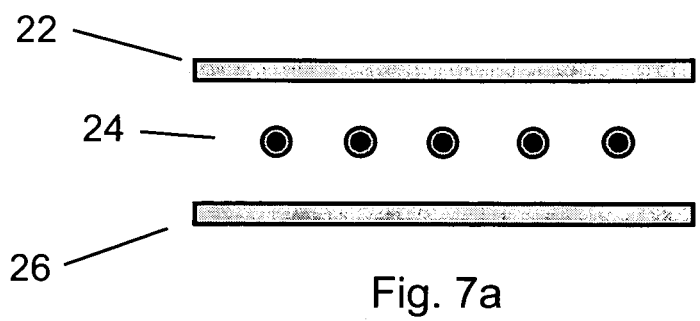
FIGS. 7a-7d shows a cross-sectional view of another example of the method of the present invention.
Figure 7B:
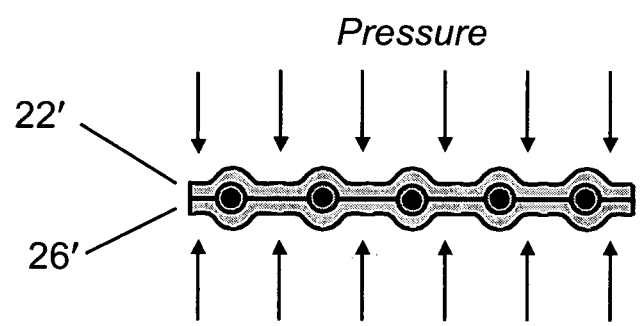
Figure 7C:
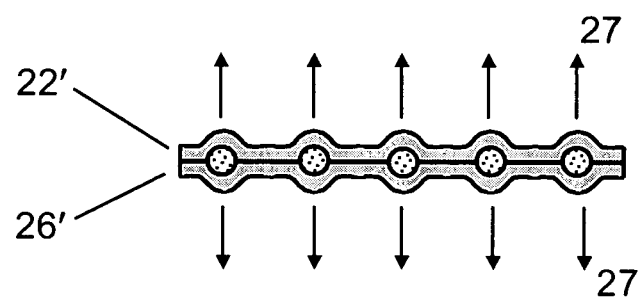
Figure 7D:
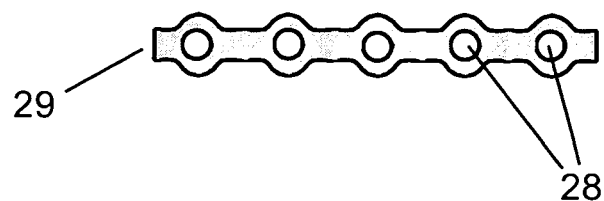

In the present invention, during the lamination step, it would be possible to use a lower lamination pressure (and, possibly, lower temperature) if an adhesive or solvent is pre-placed on one or more of the layers 12, 16. In this case, the adhesive bonds the layers together; consequently, the pressure applied during laminating only has to be large enough to deform the layers around mandrel 14 until the two layers 12, 16 contact each other and become bonded. FIGS. 7a-7d shows a cross-sectional view of another example of the method of the present invention. First, in FIG. 7a, multiple sacrificial mandrels 24 are placed in-between deformable dielectric layers 22 and 26. Mandrels 24 may have the shape of a wire, tube, rod, cylinder, or sphere, disk, or a combination of those shapes. Then, in FIG. 7b, isostatic pressure is applied during lamination to deform the two layers 22' and 26' around mandrels 24, and to adhere the two layers 22' and 26' together. Next, in FIG. 7c the assembly is heated to burnout and remove the sacrificial mandrels 24, and to burnout the unfired ceramic layers 22', 26'. Finally, in FIG. 7d, the sacrificial mandrels 24 have been substantially removed, and the structure has been fired into a dense, monolithic ceramic structure 29 with a plurality of internal cavities 28.

Figure 8A:
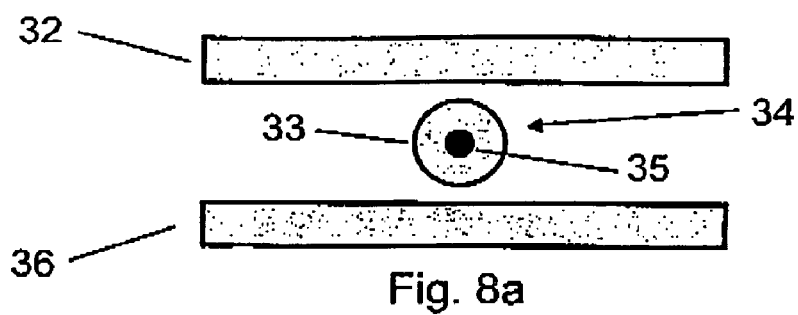
FIGS. 8a-8d shows a cross-sectional view of another example of the method of the present invention.
Figure 8B:
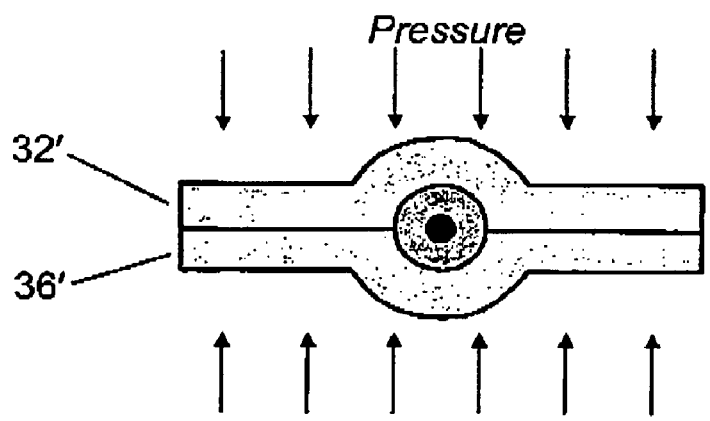
Figure 8C:
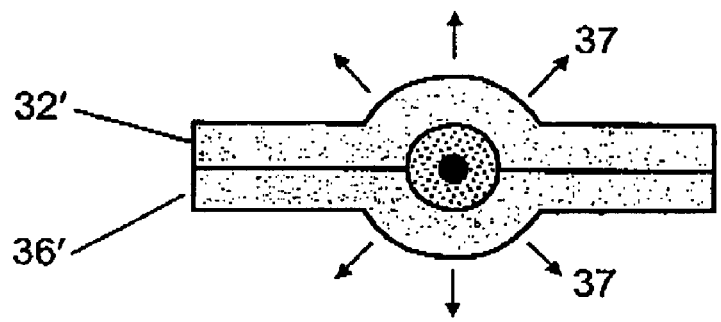
Figure 8D:
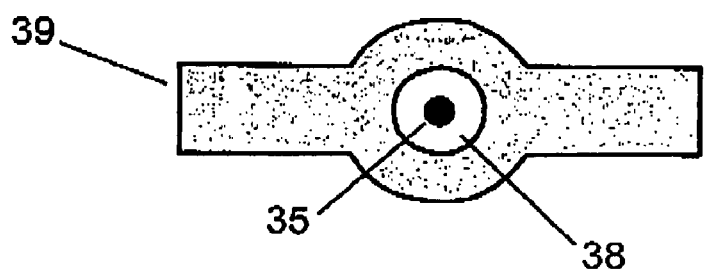

FIGS. 8a-8d shows a cross-sectional view of another example of the method of the present invention. First, in FIG. 8a, sacrificial mandrel 34 is placed in-between deformable (e.g., unfired ceramic) layers 32 and 36. Mandrel 34 may have the shape of a wire, tube, rod, cylinder, or sphere, disk, or a combination of those shapes. Mandrel 34 is a composite structure, with an inner core 35 made of non-sacrificial material (e.g., copper, glass, etc.), surrounded by an outer annulus of sacrificial material 33. Then, in FIG. 8b, isostatic pressure is applied during lamination to deform the two layers 32' and 36' around mandrel 34, and to adhere the two layers 32' and 36' together on either side of mandrel 34. Next, in FIG. 8c the assembly is heated to burnout and remove the sacrificial material from mandrel 34, and to burnout the unfired ceramic layers 32', 36'. Finally, in FIG. 8d, after burnout, sacrificial mandrel 34 has been substantially removed, and the layers has been fired into a dense, monolithic ceramic structure 39 with internal cavity 38 and free-standing core 35. Freestanding core 35 may comprise a fiber optic that is free to deflect inside cavity 38 (while being held at another position further along the length of fiber 35), or a spherical ball or disk that is free to move around (i.e., rattle around) inside of cavity 38, for example.

Figure 9A:
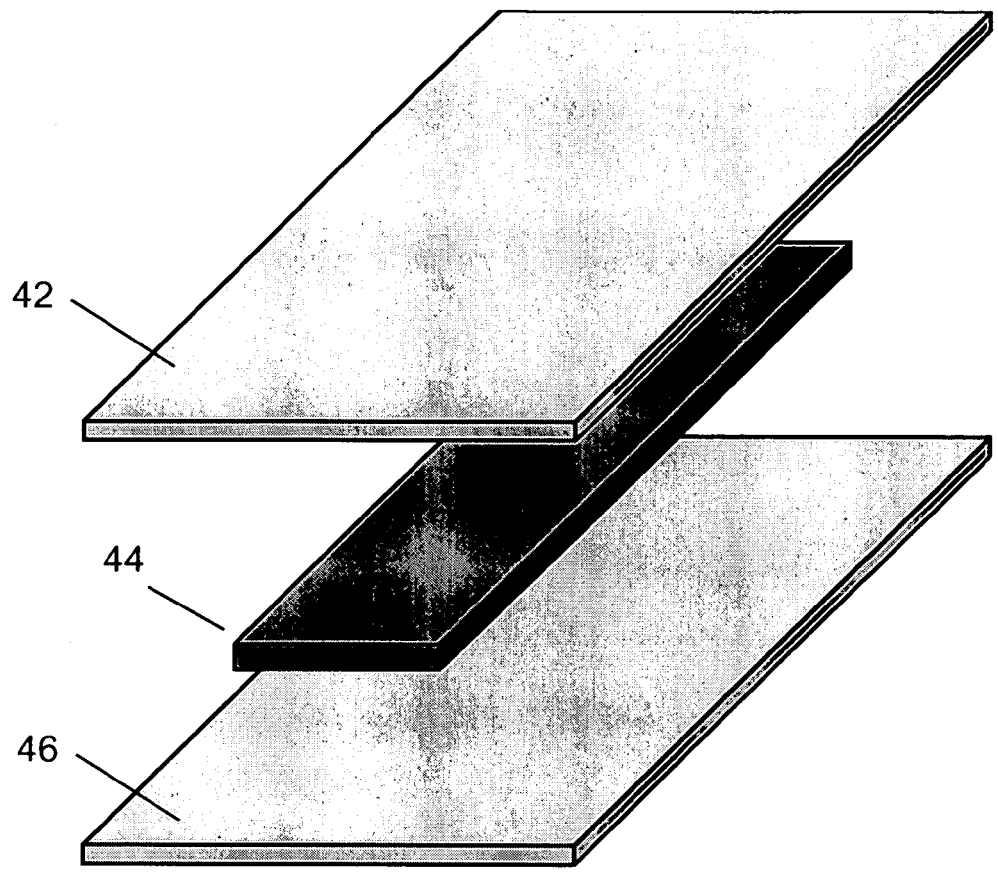
FIGS. 9a-9d shows an isometric view of another example of the method of the present invention.
Figure 9B:
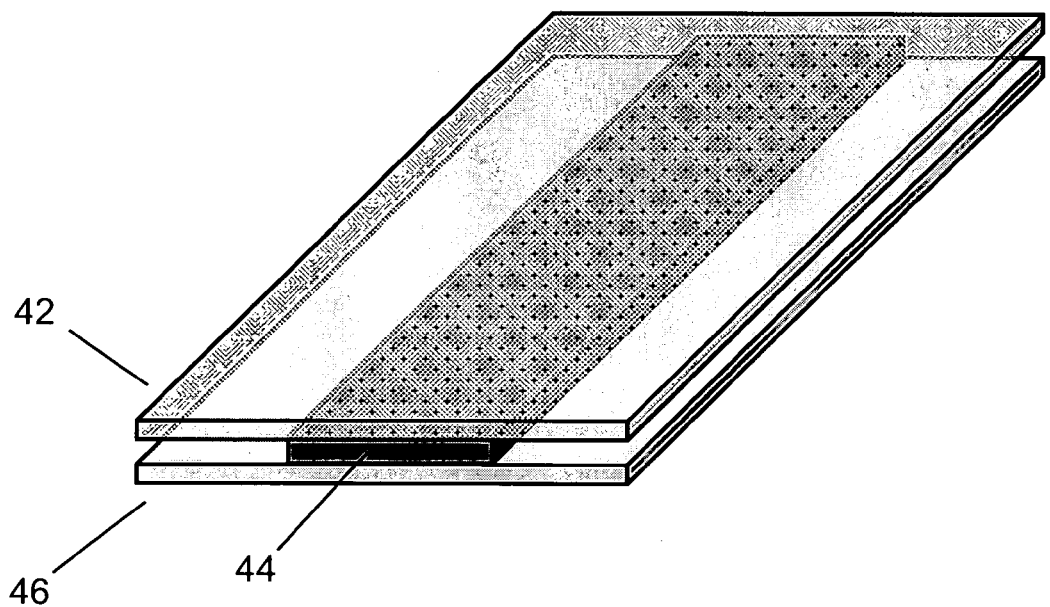
Figure 9C:
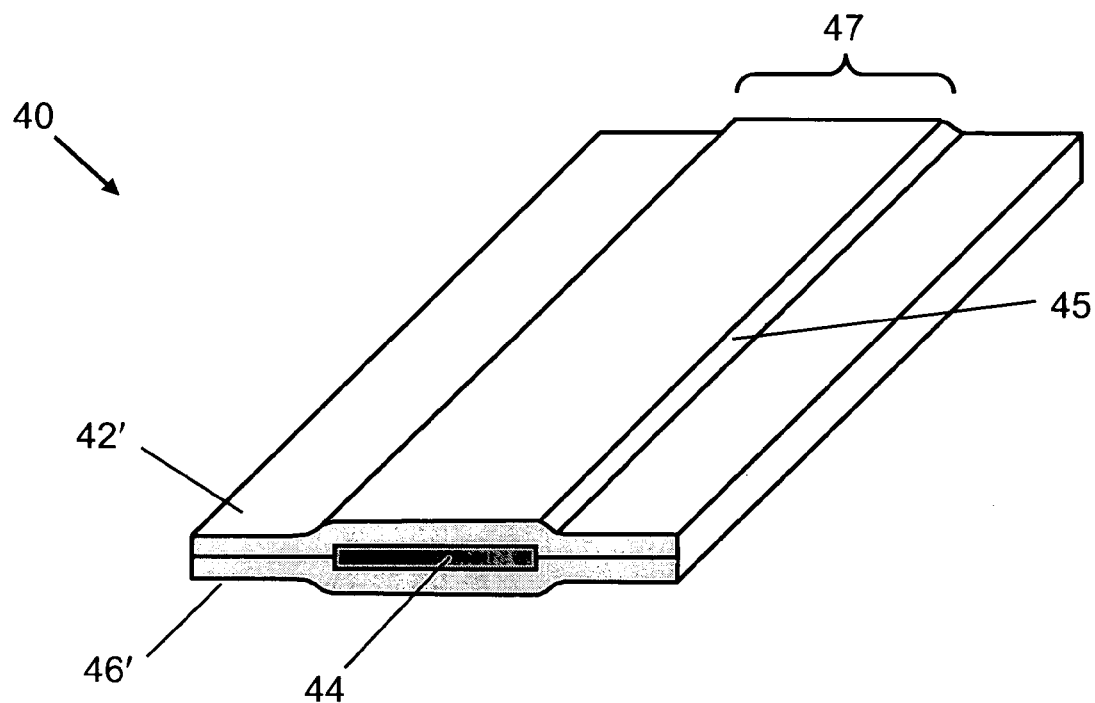
Figure 9D:
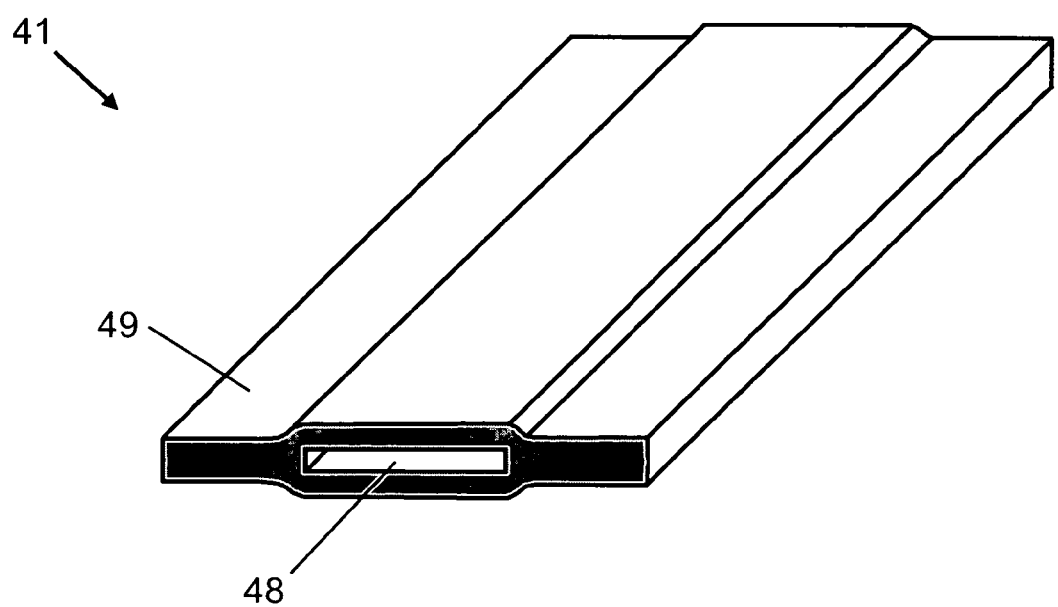

FIGS. 9a-9d shows an isometric view of another example of the method of the present invention. First, in FIG. 9a, sacrificial mandrel 44 is placed in-between deformable dielectric layers 42 and 46. FIG. 9b shows the configuration of the three collated and stacked layers prior to lamination. Note that ends of mandrel 44 extend all the way out to the edges of sheets 42 and 46. Then, in FIG. 9c, isostatic pressure is applied during lamination to deform the two layers 42' and 46' around mandrel 44, and to adhere the two layers 42' and 46' together on either side of mandrel 44. Next, in FIG. 9d the assembly is fired to burnout and remove the sacrificial material from mandrel 44, and to burnout the unfired layers. Then, the burnt-out assembly is fired to sinter and densify the layers into a monolithic structure 49 with internal cavity 48. In this example, the internal cavity 48 is open to the outside at both ends of structure 49. These openings can, for example, allow gases evolved during burnout to exit from the openings.

Figure 10:
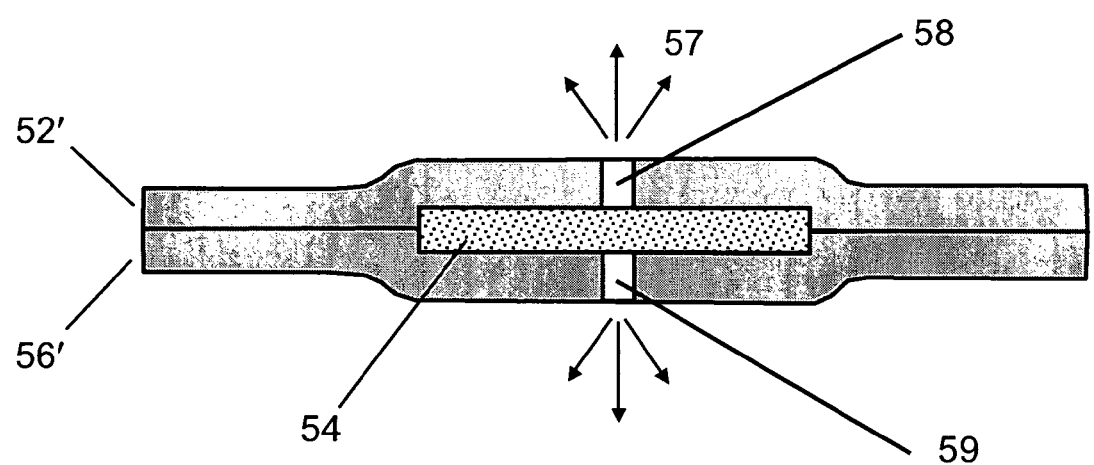
FIG. 10 illustrates a cross-sectional view of a multilayered dielectric structure during the burnout step, according to the present invention.

FIG. 10 illustrates a cross-sectional view of a multilayered dielectric structure during the burnout step, according to the present invention. In this example, vent holes 58 and 59 have been provided in deformed layers 52' and 56' to allow gases 57 evolved during the burnout step from sacrificial mandrel 54 to be directly vented to the outside. This permits faster burnout than if the gases were only limited to passing through layers 52' and 56'. After the sacrificial material has been completely removed, the vent holes 58 and 59 may be plugged in subsequent steps; or left open, as required by the application.

Figure 11A:
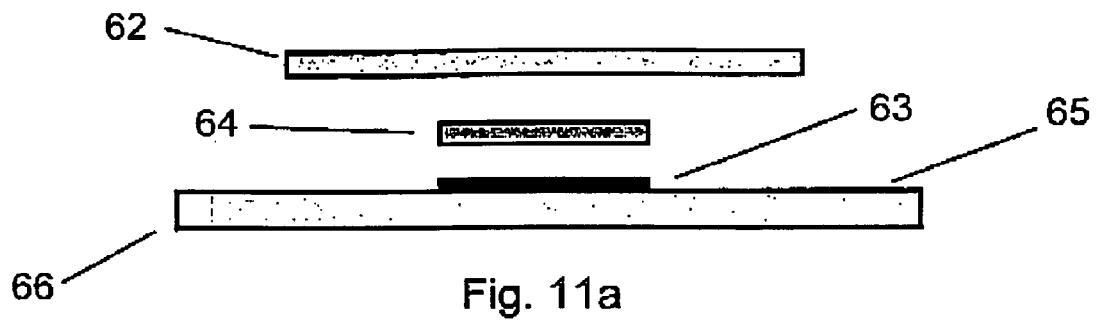
FIGS. 11a-11d shows a cross-sectional view of another example of the method of the present invention.
Figure 11B:
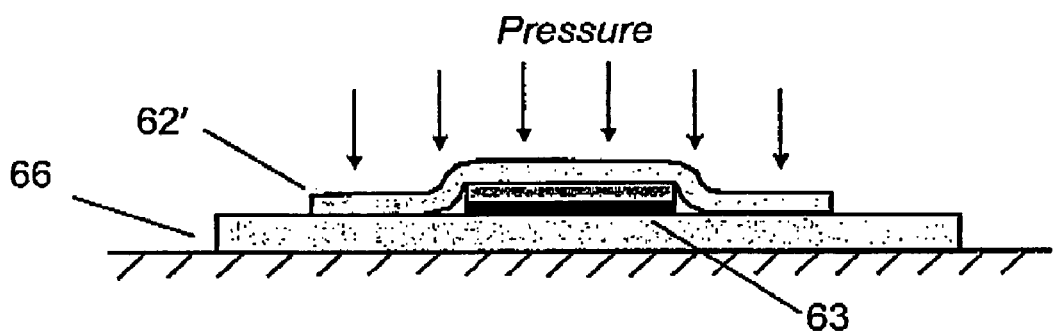
Figure 11C:
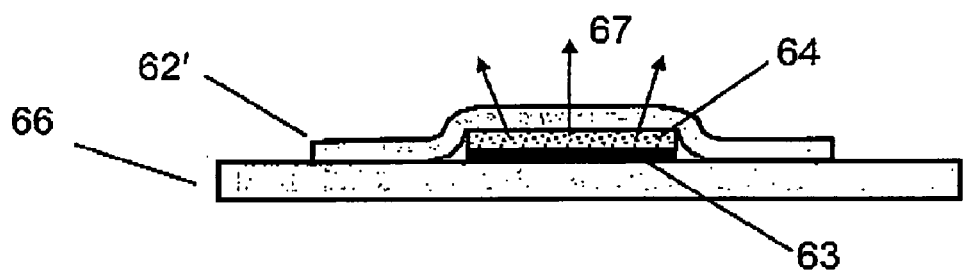
Figure 11D:
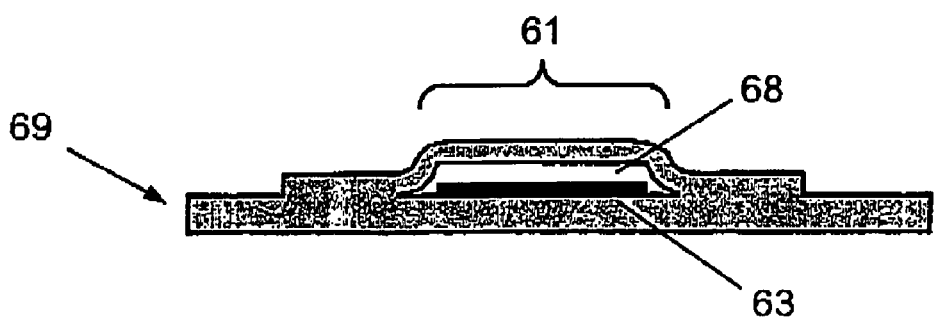

FIGS. 11a-11d shows a cross-sectional view of another example of the method of the present invention. First, in FIG. 11a, sacrificial mandrel 64 is placed in-between deformable dielectric layers 62 and 66. Additionally, a thick-film layer 63 (e.g., conductive paste) is deposited (e.g., screen-printed) onto the upper surface 65 of bottom layer 66. Next, in FIG. 11b, isostatic pressure is applied during lamination to deform layer 62' around mandrel 64 and thick-film 63, and to adhere the two layers 62' and 66 together on either side of mandrel 64. Then, in FIG. 11c the assembly is heated to burnout organic constituents in layers 62' and 66, thick-film 63, and to remove sacrificial mandrel 64 by evolving gases 67. Then, in FIG. 11d the burnt-out assembly is fired to sinter and densify the layers into a monolithic structure 69 with internal cavity 68. In this example, thick-film deposit 63 is exposed to the interior of cavity 68. Optionally, if cavity 68 is open to the outside, then thick-film deposit 63 would also be exposed to the outside environment. The structure shown in FIG. 11d provides new possibilities for firing thick film 63, since the surface of the thick film deposit 63 is not touching the backside of a LTCC layer; rather, it is freely exposed to its own microclimate atmosphere (if cavity 68 is a blind volume); or exposed to the outside atmosphere (if cavity 68 is connected to the outside).

Figure 12A:
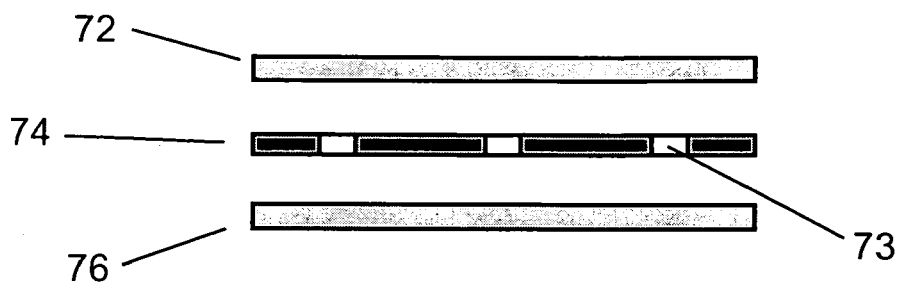
FIGS. 12a-12d shows a cross-sectional view of another example of the method of the present invention.
Figure 12B:
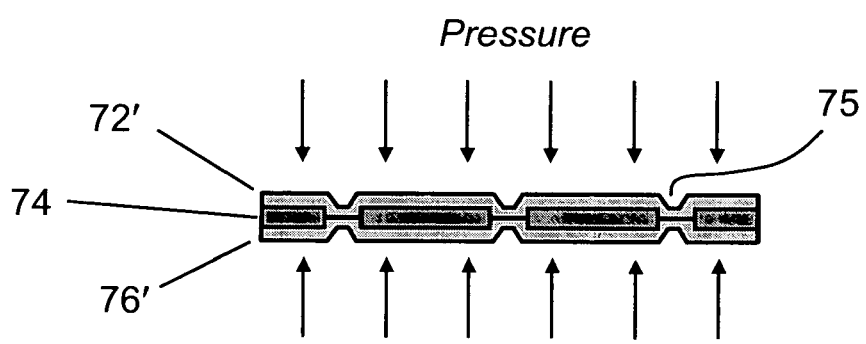
Figure 12C:
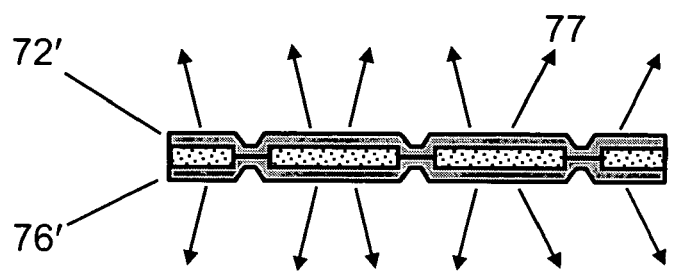
Figure 12D:
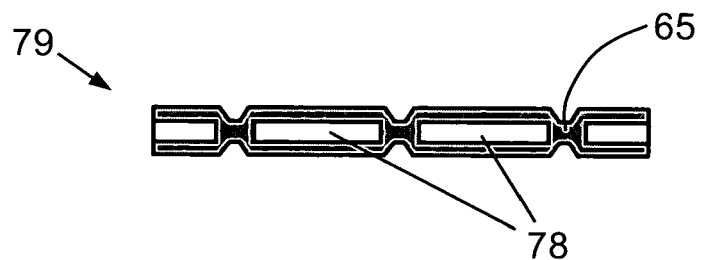

FIGS. 12a-12d shows a cross-sectional view of another example of the method of the present invention. First, in FIG. 12a, sacrificial mandrel 74 is placed in-between deformable layers 72 and 76. Mandrel 74 is perforated with a plurality of thru-holes 73, which can be arranged in a regular pattern. Next, in FIG. 12b, isostatic pressure is applied during lamination to deform and push the two layers 72' and 76' into holes 73 sufficiently far to make the two layers 72' and 76' contact each other inside of hole 73. The diameter of holes 73 must be sufficiently large to allow the two layers 72' and 76' to contact each other inside of hole 73. The deformation of 72' and 76' into holes 73 results in depressions or dimples 75 in the surface of the two layers 72' and 76'. Then, in FIG. 12c the assembly is heated to burnout organic constituents in layers 72' and 76', and to remove sacrificial mandrel 74 by evolving gases 77. Then, in FIG. 12d the burnt-out assembly is fired to sinter and densify the layers into a monolithic structure 79 with multiple internal cavities 78 and a plurality of spaced-apart, supporting posts/pillars 65. In this example, structure 79 comprises a large internal volume, which can be used to store liquid or gases, e.g., in a micro-fuel cell. Alternatively, the interior of cavities 78 may be evacuated with a vacuum, which allows structure 79 to act as an efficient thermal insulator.

Figure 13:
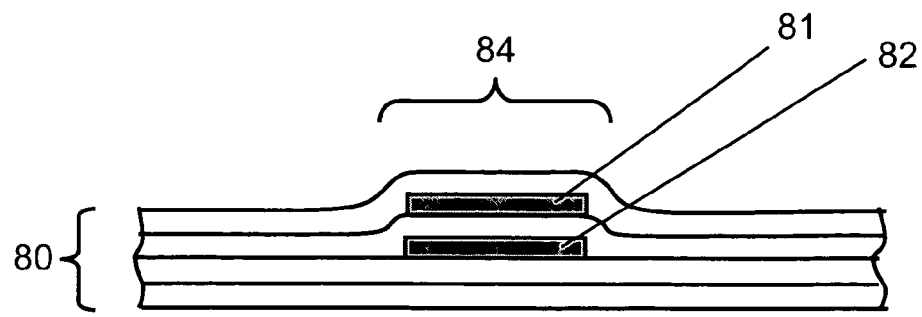
FIG. 13 shows a cross-sectional view of another example of a multilayered dielectric structure with internal cavities, according to the present invention.

FIG. 13 shows a cross-sectional view of another example of a multilayered dielectric structure with internal cavities, according to the present invention. This cross-section view illustrates the process just after the lamination step has been completed. Here, two different sacrificial mandrels 81 and 82 have been placed in-between multiple layers 80, with the two mandrels 81, 82 aligned on top of each other, separated by at least one layer of deformable dielectric material. During lamination, the layers 80 deform around mandrels 81 and 82, thereby creating a prominent raised feature (i.e., bump, mesa) 84 above the mandrels 81, 82.

Figure 14A:
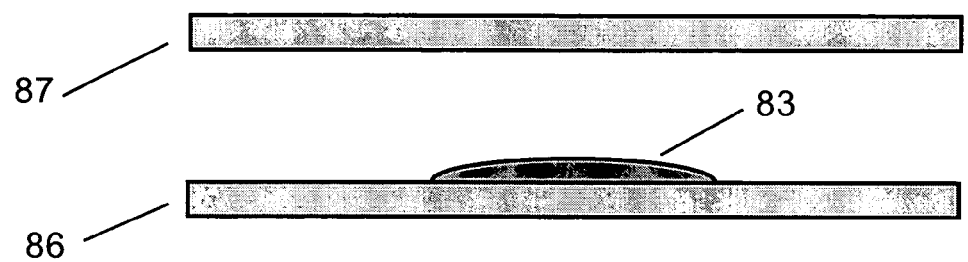
FIGS. 14a-14b shows a cross-sectional view of another example of the method of the present invention.
Figure 14B:
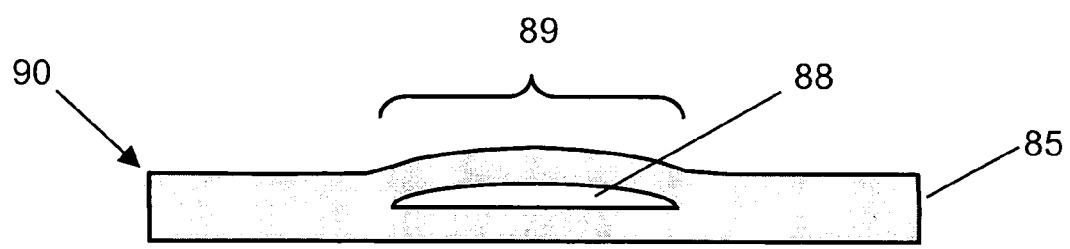
Figure 15A:
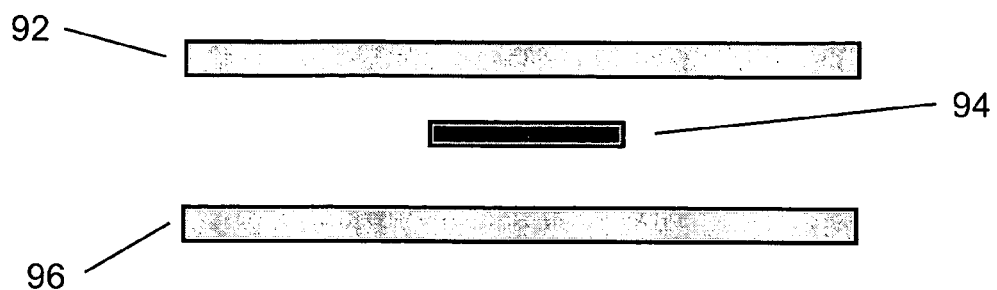
FIGS. 15a-15d shows a cross-sectional view of another example of the method of the present invention.
Figure 15B:
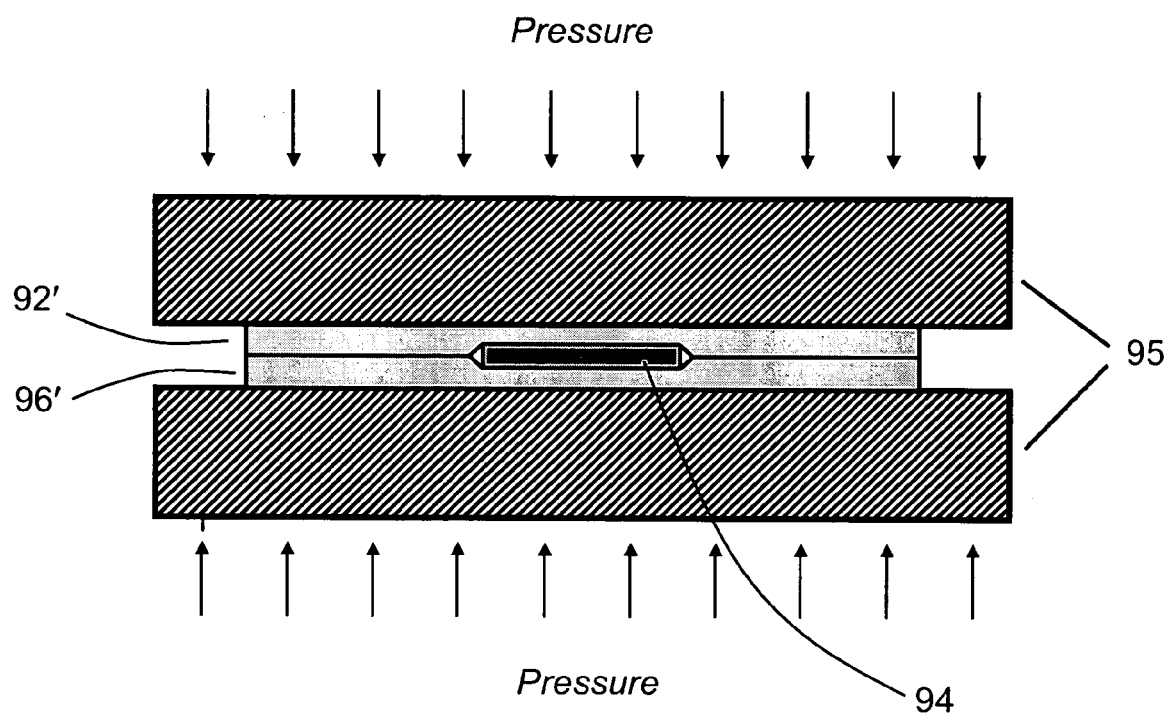
Figure 15C:
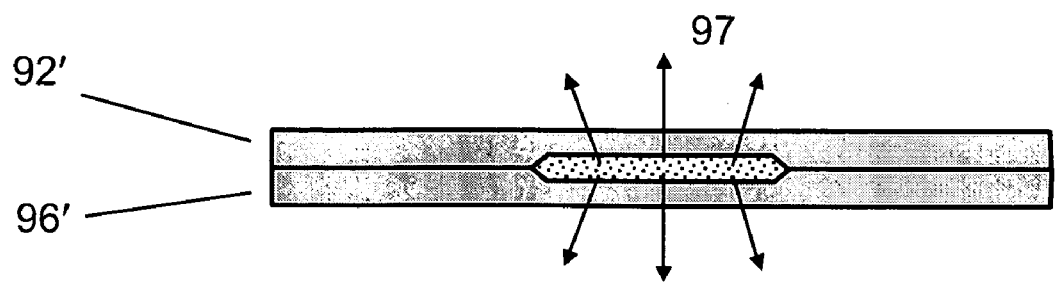
Figure 15D:
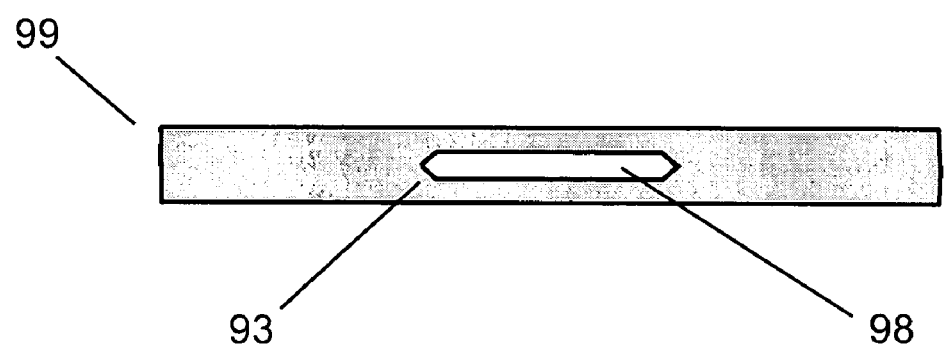

FIGS. 14a-14b shows a cross-sectional view of another example of the method of the present invention. First, in FIG. 14a, sacrificial mandrel 83 is placed in-between deformable layers 87 and 86. Mandrel 83 is deposited directly on to lower layer 86 in the wet state (i.e., wet deposited, wet defined), as a ink or paste deposited by screen-printing, micropen writing, stamping, stenciling, etching, laser trimming, etc. The cross-sectional shape of mandrel 83 is curved and has the shape of a drop that has partially-flattened and spread-out (the amount of spreading depends on surface tension, etc.). The wet-deposited mandrel 83 preferably is dried prior to lamination, to prevent further flattening and spreading under pressure. FIG. 14b illustrates the final structure 90, after lamination, burn-out, and firing. Internal cavity 88, formed by the removal of sacrificial mandrel 83, has the same curved, spread-out, drop-like shape of mandrel 83. Also, protruding bump 89 has approximately the same curved shape, without any abrupt or sharp corners on its edges.

FIGS. 15a-15d shows a cross-sectional view of another example of the method of the present invention. First, in FIG. 15a, sacrificial mandrel 94 is placed in-between deformable dielectric layers 92 and 96. Next, in FIG. 15b, the stacked and collated layers 92/94/96 is placed in-between rigid anvils 95, in a uniaxial press. Rigid anvils 95 apply uniaxial pressure during lamination to deform layers 92' and 96' around mandrel 94. The upper surface of layer 92' and the lower surface of layer 96' both remain flat after lamination due to the constraint by rigid anvils 95 (i.e., there is no external protrusion or bump above the sacrificial mandrel 94). Then, in FIG. 15c the assembly is heated to burnout organic constituents in layers 92' and 96', and to remove sacrificial mandrel 94 by evolving gases 97. Then, in FIG. 15d the burnt-out assembly is fired to sinter and densify the layers into a monolithic structure 99 with internal cavity 98. Note that the internal corners 93 of cavity 98 have a rounded shape, due to incomplete closure of the gap next to mandrel 94 during lamination, in this example.

Figure 16:
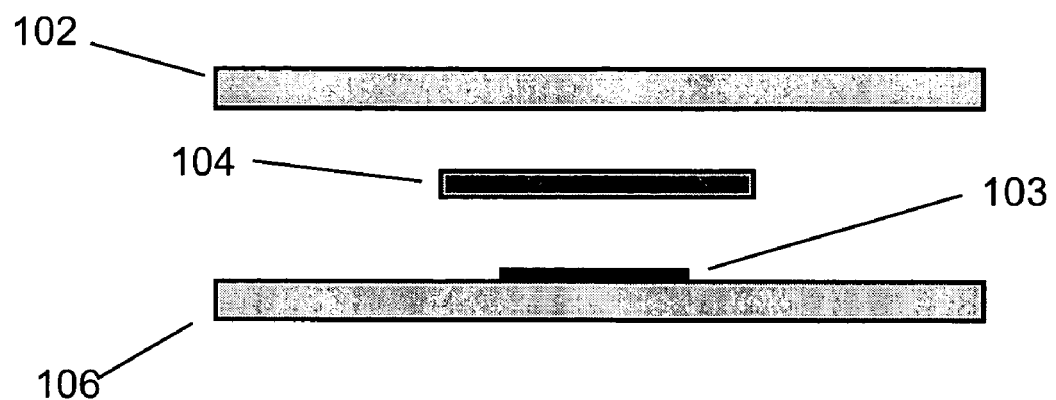
FIG. 16 shows a cross-sectional view of another example of the method of the present invention.

FIG. 16 shows a cross-sectional view of another example of the method of the present invention. Sacrificial mandrel 104 is placed in-between deformable layers 102 and 106. Additionally, a thin or thick-film deposit 103 is deposited on layer 106, in-between layer 106 and mandrel 104. This arrangement is similar to that shown in FIGS. 11a-11d, except that the width of mandrel 104 is greater than the width of deposit 103. The other process steps are the same as before, and, hence, are not illustrated here.

Figure 17:
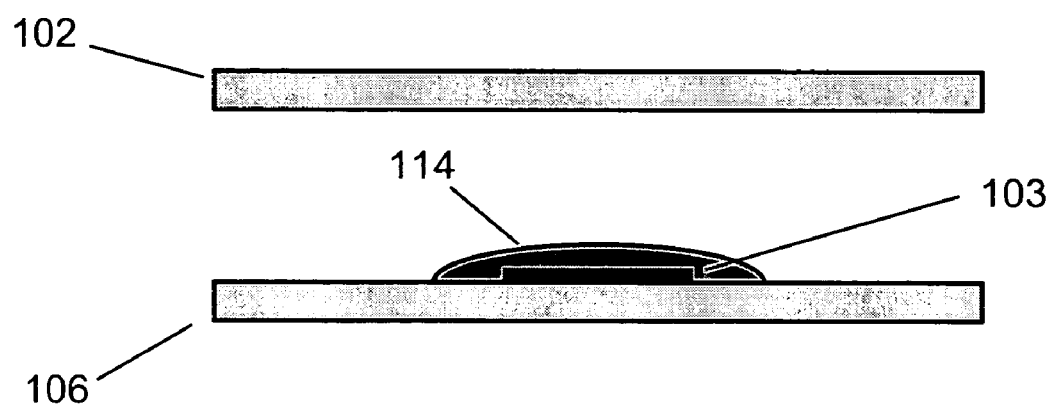
FIG. 17 shows a cross-sectional view of another example of the method of the present invention.

FIG. 17 shows a cross-sectional view of another example of the method of the present invention. Sacrificial mandrel 114 is placed in-between deformable dielectric layers 102 and 106. A thin-film or thick-film deposit 103 is deposited on layer 106, in-between layer 106 and mandrel 104. In this example, mandrel 114 has been wet-deposited on layer 106, which subsequently has dried into a curved, drop-like shape. Mandrel 114 completely covers thick-film deposit 103. The other process steps are the same as before, and, hence, are not illustrated here.

Figure 18A:
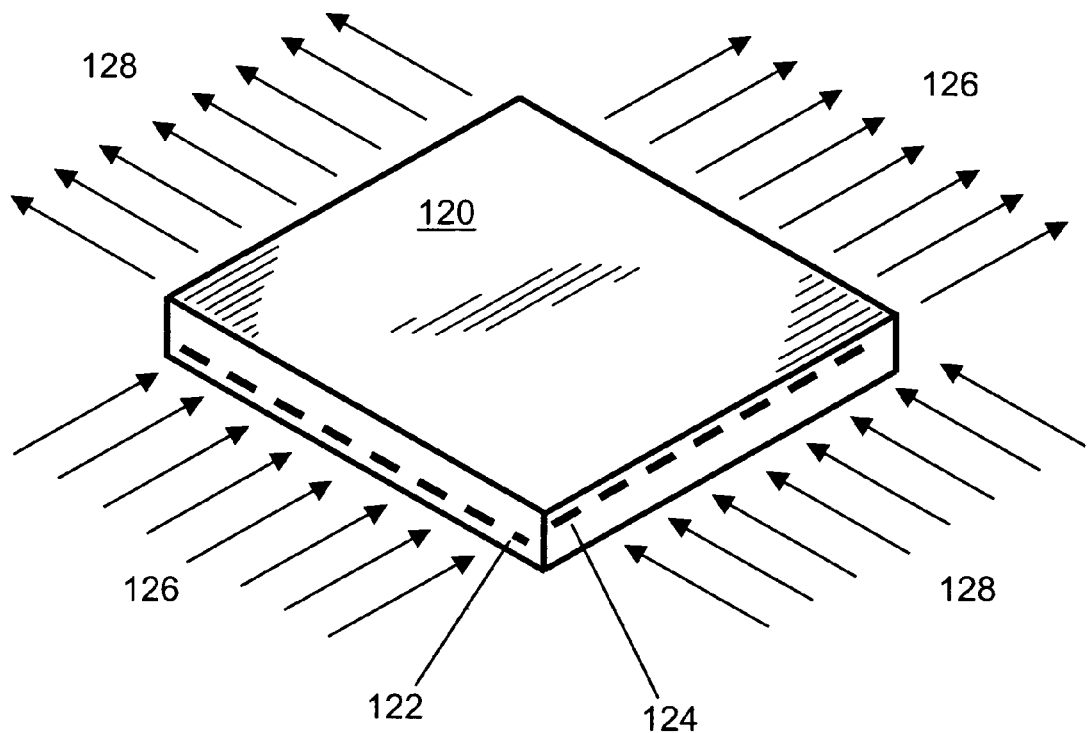
FIG. 18a illustrates an isometric view of an example of a multilayered, dielectric structure manufactured according to the methods of the present invention.

FIG. 18a illustrates an isometric view of an example of a multilayered, dielectric structure manufactured according to the methods of the present invention. Structure 120 comprises a lower level of multiple, parallel channels 122 and an upper level of multiple, parallel channels 124. The two sets of flow channels 122, 124 are oriented orthogonal to each other. This allows for a liquid or gas 126 to flow through structure 120 in a direction orthogonal to the flow of another (or the same) liquid or gas 128. Such a structure could be used as a miniature cross-flow heat exchanger, for example. Parallel channels 122 and 124 are made by using parallel strips of sacrificial material.

Figure 18B:
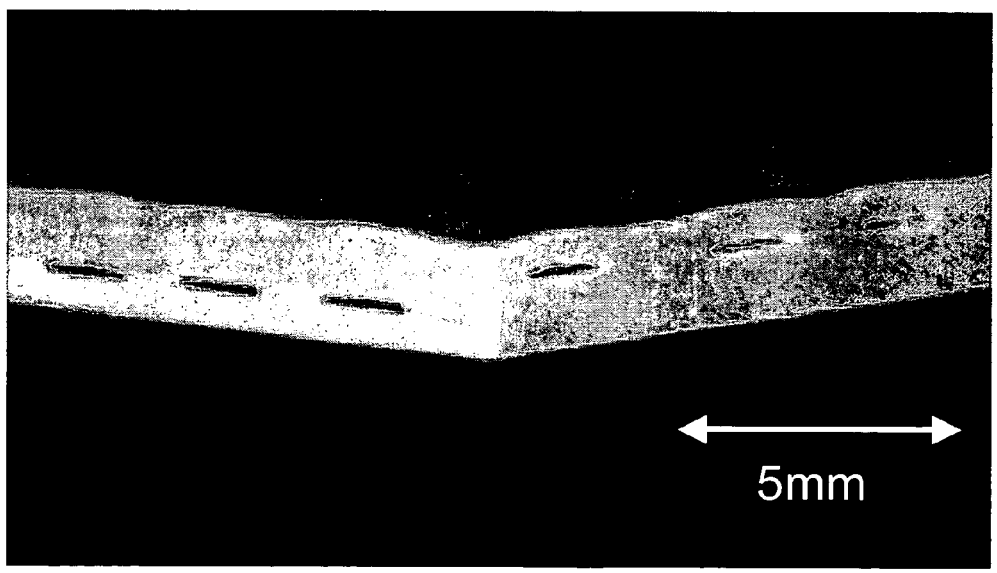
FIG. 18b shows a photograph of a ceramic structure similar to that described in FIG. 18a, manufactured using the methods of the present invention.

FIG. 18b shows a photograph of a ceramic structure similar to that described in FIG. 18a, manufactured using the methods of the present invention. The materials and technique used for this sample is similar to that described earlier with respect to the first sample shown in FIG. 5e. Notice that the upper, outside surface of the structure is wavy and dimpled, which was produced when the upper layers of green tape permanently deformed around the multiple, parallel strips of sacrificial mandrels (on both levels) during lamination. Gas flow experiments on this sample confirmed that all of the microchannels were open (i.e., not clogged or collapsed), and that no "cross-talk" or leakage occurred between channels on the two different levels.

Figure 19:
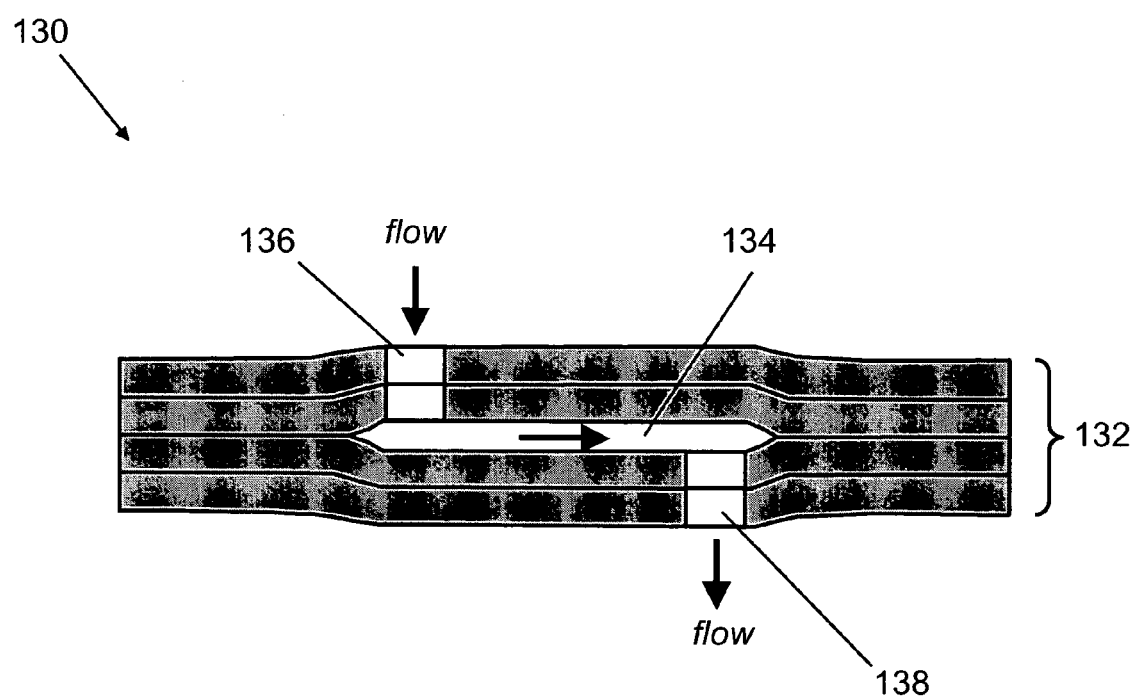
FIG. 19 illustrates a cross-section view of a schematic example of a three-dimensional, multilayered, dielectric structure manufactured according to the methods of the present invention.

FIG. 19 illustrates a cross-section view of a schematic example of a three-dimensional, multilayered, dielectric structure manufactured according to the methods of the present invention. Structure 130 comprises four layers 132 of LTCC green tape, with an interior cavity 134 manufactured using the sacrificial mandrel method of the present invention. Additionally, open vias 136 and 138 (i.e., access ports) pass in a perpendicular direction (i.e., Z-direction) through the layers 132 to provide an open pathway from interior cavity 134 to the outside. In this example, a liquid or gas flows through via 136 into cavity 134 and out through via 138.

Figure 20:
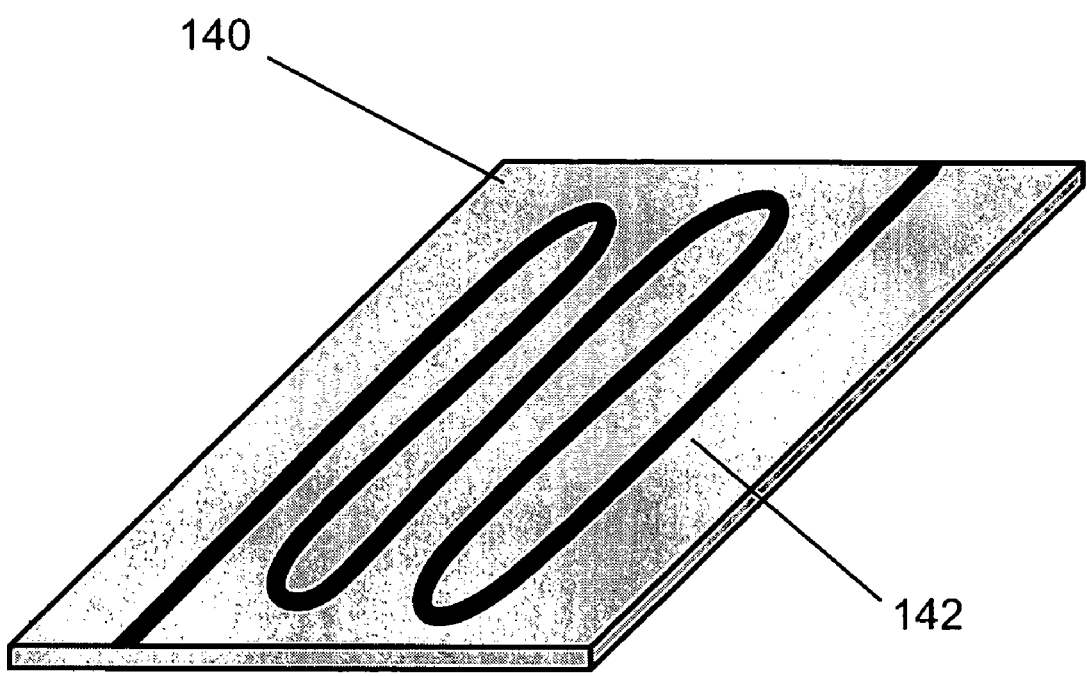
FIG. 20 illustrates an isometric view of an example of a sacrificial mandrel manufactured according to the methods of the present invention.

FIG. 20 illustrates an isometric view of an example of a sacrificial mandrel manufactured according to the methods of the present invention. Sacrificial mandrel 142 comprises a curved line shaped in a serpentine pattern that has been deposited and dried on sheet 140. The beginning and end of the serpentine line 142 extend out to the edges of sheet 140, which would allow the internal cavity (not shown) formed by the removal of mandrel 142 to be open to the outside at both ends. Mandrel 142 may be deposited directly on to sheet 140 in the wet state, e.g., by screen-printing, MicroPen writing, stamping, stenciling, ink jet printing, etc. A LTCC structure with a serpentine interior cavity was successfully fabricated and pressure tested by the author with no problems using the techniques of the present invention. Note that it would be very difficult and expensive to manufacture such a serpentine channel using the prior art techniques of making a matching insert to be placed in a cutout volume having the precisely identical serpentine geometry.

Figure 21A:
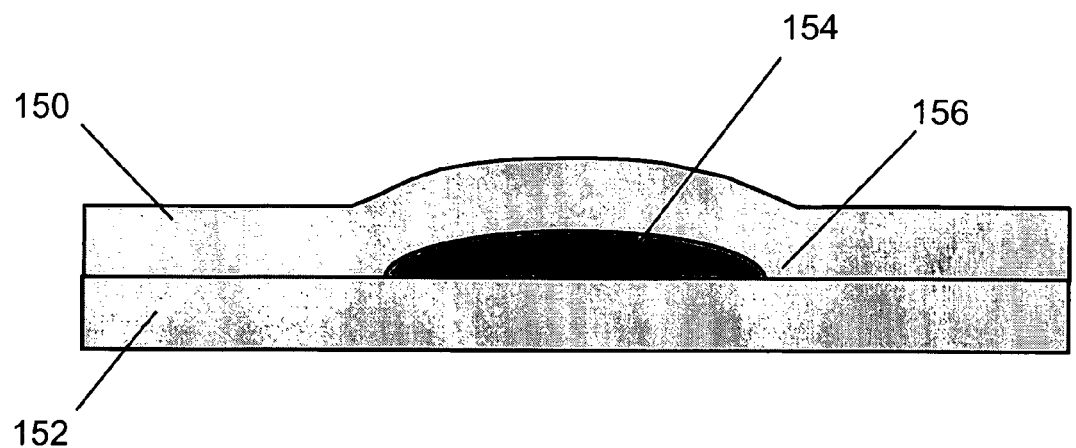
FIGS. 21a-21b illustrate a cross-section view of an example of a multilayered, dielectric structure manufactured according to the methods of the present invention.
Figure 21B:
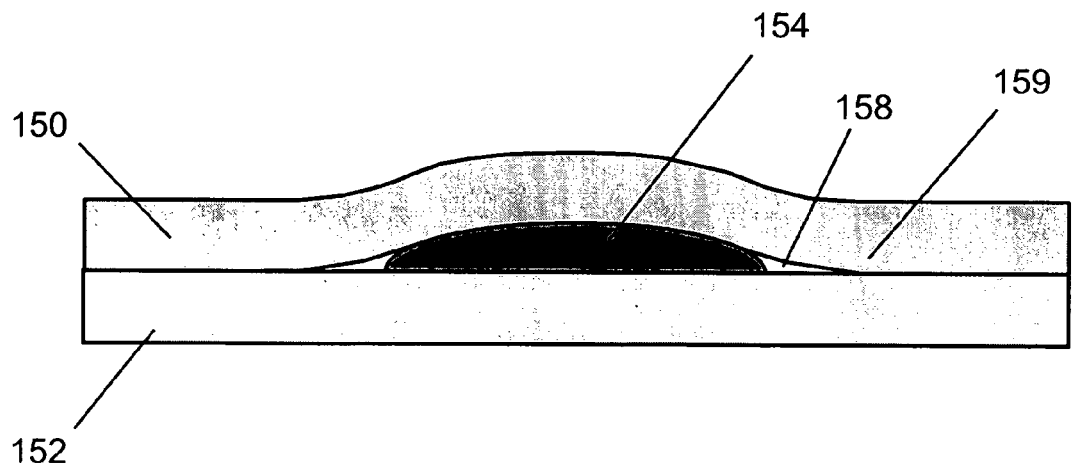

FIG. 21a illustrates a cross-section view of an example of a multilayered, dielectric structure manufactured according to the methods of the present invention. Here, upper layer 150 has been laminated onto lower sheet 152 (which has been held rigid). Layer 150 has completely deformed around elliptical-shaped sacrificial mandrel 154, with no gaps at the edges of mandrel 154. In contrast, FIG. 21b illustrates the same geometry, except where layer 150 has incompletely deformed around mandrel 154, leaving gap 158 and shallow "crack" 159. Incomplete closure of gap 158 and "crack" 159 (possibly caused by inadequate lamination pressure) may lead to delamination between the two layers 150 and 152 during subsequent processing or use. Hence, the geometry shown in FIG. 21a, showing complete closure around the edges of mandrel 154, is preferred.

Figure 22:
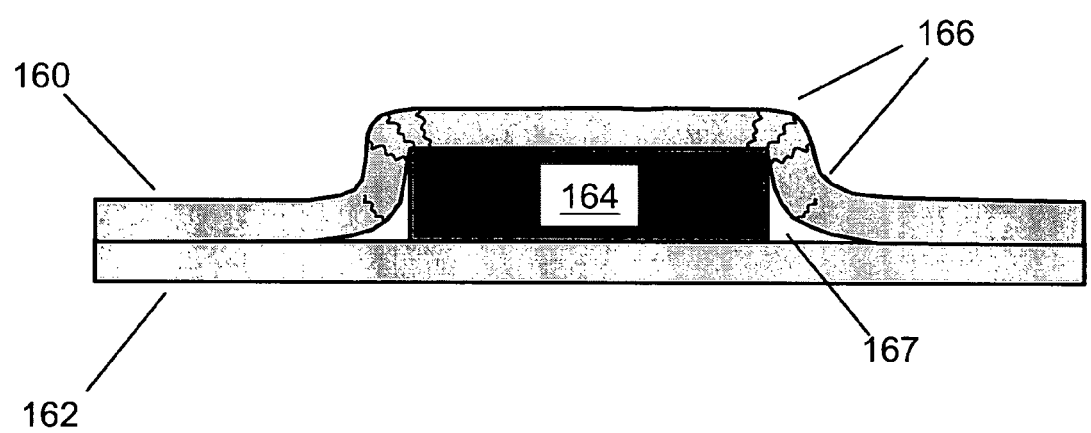
FIG. 22 illustrates a cross-section view of an example of a multilayered, dielectric structure manufactured according to the methods of the present invention.

FIG. 22 illustrates a cross-section view of an example of a multilayered, dielectric structure manufactured according to the methods of the present invention. Thin upper layer 160 has been laminated onto lower sheet 162, with layer 160 being deformed around sacrificial mandrel 164. The problem illustrated in this example is formation of undesirable cracks 166 at places where the deformed layer 160 has large bends/curvature (i.e., large strains), which are concentrated at the corners of mandrel 164. Hence, it is important to consider and control the amount of strain that occurs at sharp corners when using this technique, especially during the lamination step. Increased lamination temperature may help to alleviate this problem by making the deformable layer 160 more plastic and easier to flow under stress without breaking. Overlayers can also be added in either parallel or sequential steps.

Figure 23A:
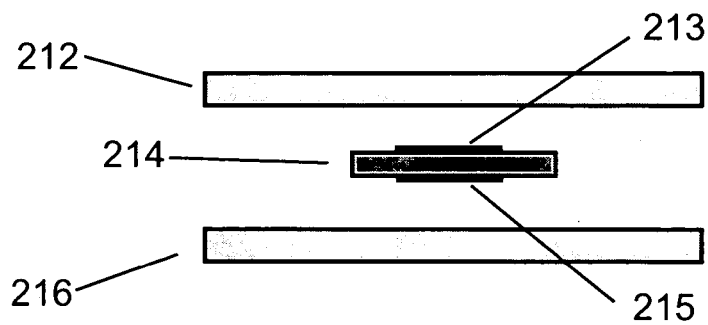
FIGS. 23a-23d shows a cross-sectional view of another example of the method of the present invention.
Figure 23B:
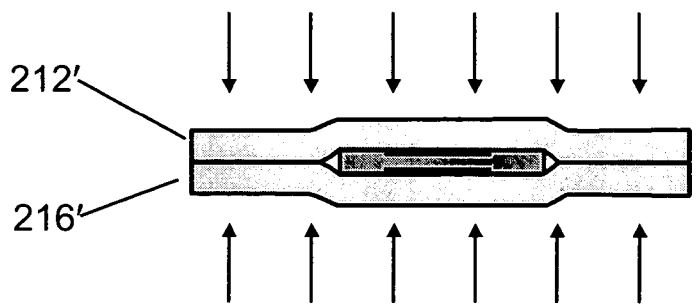
Figure 23C:
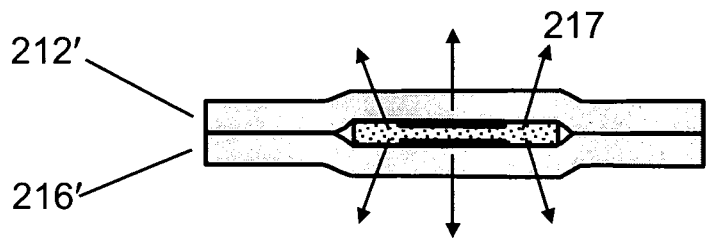
Figure 23D:
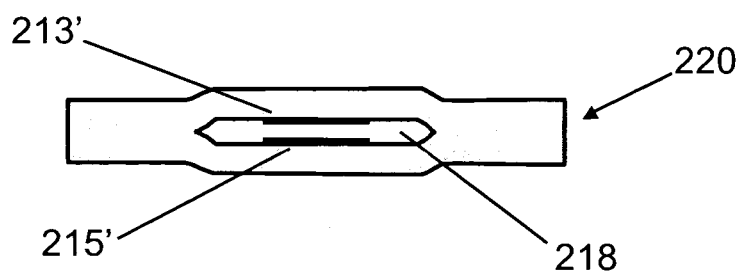

FIGS. 23a-23d shows a cross-sectional view of another example of the method of the present invention. First, in FIG. 23a, sacrificial mandrel 214 is placed in-between deformable dielectric layers 212 and 216. Additionally, think-film layers 213, 215 (e.g., conductive paste) have been deposited (e.g., screen-printed) onto the upper and lower surfaces of mandrel 214, respectively. Next, in FIG. 23b, isostatic pressure is applied during lamination to deform the two layers 212 and 216 around mandrel 214 with thick-film coatings 213, 215; and to adhere the two layers 212' and 216' together on either side of mandrel 214. Then, in FIG. 23c the assembly is heated to burnout organic constituents in layers 212' and 216', thick-films 213, 215, and to remove sacrificial mandrel 214 by evolving gases 217. Then, in FIG. 23d the burnt-out assembly is fired to sinter and densify the layers into a monolithic structure 220 with internal cavity 218 and to make conductive electrodes (metallized thick film deposits) 213', 215' on the upper and lower interior surfaces of cavity 218, respectively. Thick-film deposits 213', 215' are exposed to the interior of cavity 218. Optionally, if cavity 218 is open to the outside at the end or ends of structure 220, then thick-film deposits 213', 215' would also be exposed to the outside environment via cavity 220. Hence, the structure shown in FIG. 23d provides new possibilities for firing thick-film deposits 213', 215', since the surface of the thick films are not touching the backside of a LTCC layer; rather, they is exposed to their own microclimate atmosphere (in a blind volume), or exposed to the outside atmosphere (in an cavity connected to the outside).

Figure 24A:
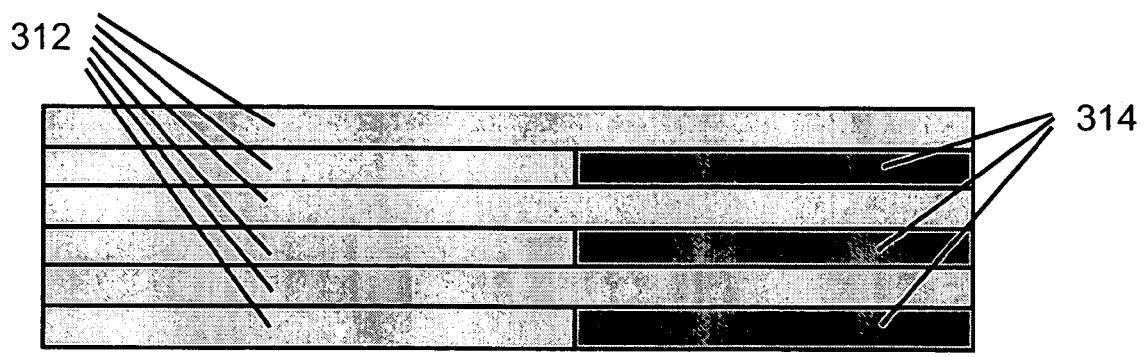
FIGS. 24a-24b shows a cross-sectional view of another example of the method of the present invention.
Figure 24B:
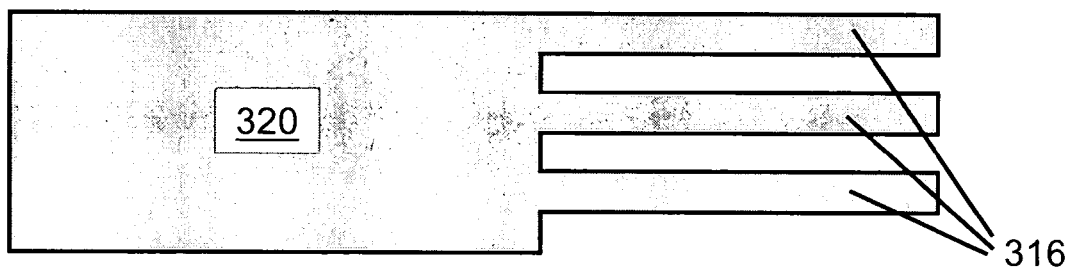

FIGS. 24a-24b shows a cross-sectional view of another example of the method of the present invention. FIG. 24a shows a six-layer stackup of LTCC sheets 312, with three pieces of sacrificial material 314 placed in-between the overhanging portions of LTCC sheet 312, prior to burnout and firing. FIG. 24b shows the monolithic ceramic structure 320 after burnout and firing, showing overhanging or cantilevered sections 316. This high-aspect ratio channels could be used for heat pipe wicks, for example. This type of construction could also be used for a meso structure, such as a LTCC cantilever with deflection or sensing electrodes (not shown).

Figure 25:
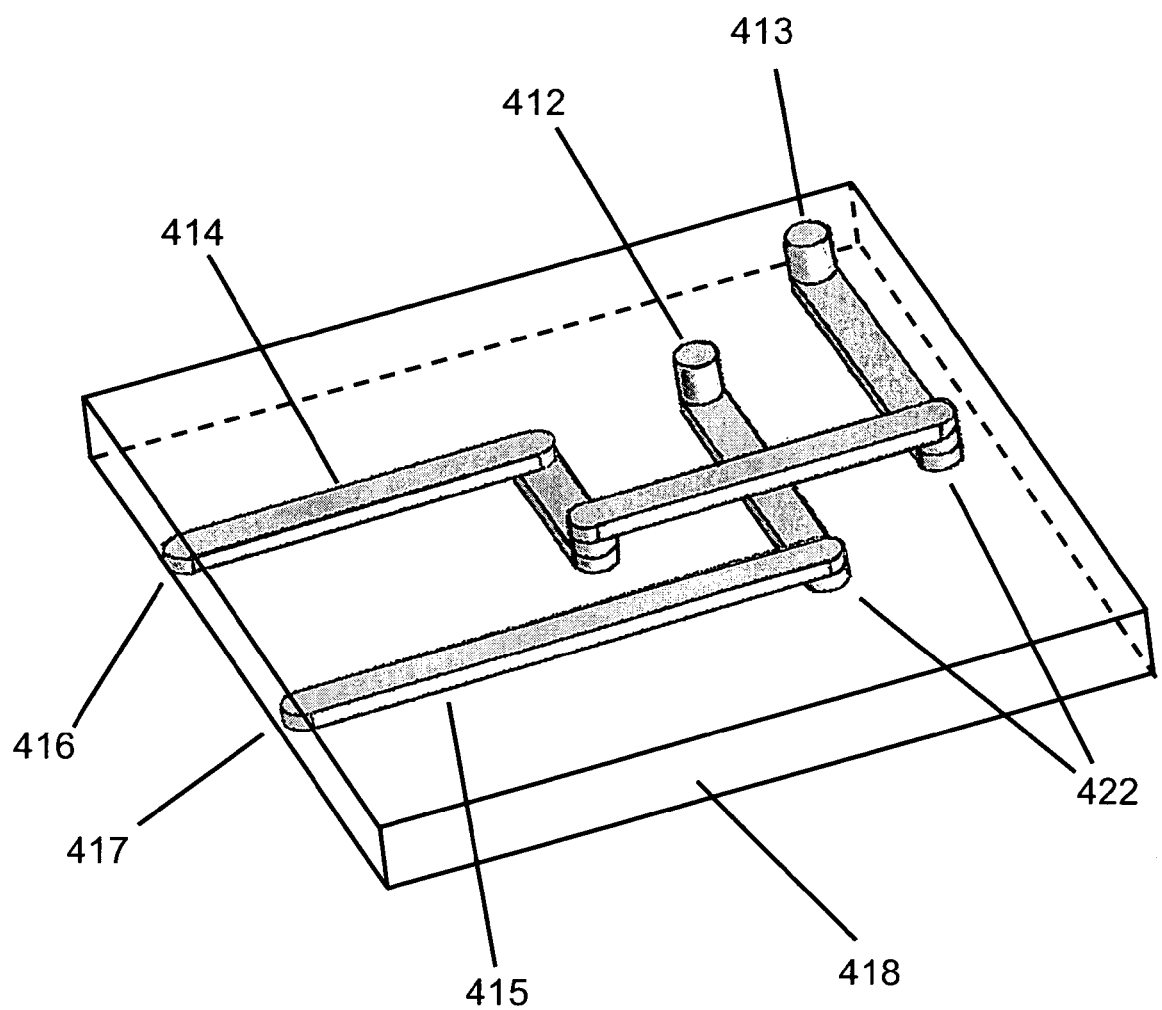
FIG. 25 shows an isometric view of an example of a dielectric structure with internal flow channels fabricated according to the methods of the present invention.

FIG. 25 shows an isometric view of an example of a multilayered ceramic structure with internal flow channels fabricated according to the methods of the present invention. Structure 418 comprises a pair of 3-D flow channels 414, 415 manufactured using a series of interconnected sacrificial mandrels. Flow channels 414, 415 comprise a series of horizontal channels connected to other horizontal channels on a different level through vertical vias 422. Flow channels 414, 415 comprise openings 416, 417, respectively, on one end of structure 418 where the channels intersect the outer surface. Also, flow channels 414, 415 comprise access ports 412, 413, respectively, where vertical vias intersect the upper surface.

The particular examples discussed above are cited to illustrate particular embodiments of the invention. Other applications and embodiments of the apparatus and method of the present invention will become evident to those skilled in the art. It is to be understood that the invention is not limited in its application to the details of construction, materials used, and the arrangements of components set forth in the following description or illustrated in the drawings.

The scope of the invention is defined by the claims appended hereto.

What is claimed is:

1. A method of fabricating a monolithic, ceramic body having an internal cavity, the method comprising:
    a) providing first and second sheets made of a deformable dielectric material, and providing a sacrificial mandrel made of a sacrificial material that does not comprise low melting point metal or metal alloy, Woods metal, or inorganic oxide ceramic powders greater than 3 micron diameter held in a polymer binder; then
    b) stacking the first sheet on top of the second sheet, with the sacrificial mandrel sandwiched in-between the first and second sheets, wherein the sacrificial mandrel is not inserted into a cutout made in any of the sheets; then
    c) forming a laminated structure by applying sufficient external pressure to the stack of sheets to adhere the first and second sheets together, while at the same time permanently deforming at least the first sheet around the sacrificial mandrel; and then
    d) removing the sacrificial mandrel by heating the laminated structure to a temperature sufficient to volatilize all of the sacrificial material, thereby creating an internal cavity bounded by the first and second sheets, with no spherical balls or discs disposed inside of the cavity; and then
    e) further heating the laminated structure to sinter and density the laminated sheets of dielectric material into a monolithic, ceramic body;
    wherein the sacrificial mandrel comprises a sheet of sacrificial material with a first thick-film deposit of material deposited on a first side of the sheet of sacrificial material prior to being laminated in step c);
    wherein after further heating in step e) to sinter and densify the dielectric sheets into a monolithic ceramic body, the first thick-film deposit resides on a first interior surface of the internal cavity and does not touch the opposing, second interior surface of the cavity opposite from the first interior surface.

2. The method of claim 1, wherein the deformable dielectric material is selected from the group consisting of polymer, plastic, printed wiring board material, unfired glass/ceramic LTCC material, and unfired ceramic/glass HTCC material.

3. The method of claim 1, wherein the sacrificial material comprises one or more materials selected from the group consisting of wax, carbon, graphite, carbon tape, carbon-filled slurry, porous graphite, a plasticizer, an organic binder, plastic, a water-soluble material, starch, sugar, corn starch, a material soluble in an organic solvent, photoresist, an acrylic latex in a colloidal suspension, walnut flour made by grinding walnut shells and organic gels, polypropylene, a photo-patternable material, LTCC or HTCC ceramic green-tape dielectric material made without any ceramic or glass fillers, and a low molecular weight polymer.

4. The method of claim 1, wherein the step of removing the sacrificial mandrel comprises one or more actions selected from the group consisting of baking, firing, evaporating, sublimating, pyrolyzing, disassociating, burning, and oxidizing, and combinations thereof.

5. The method of claim 1, wherein the step of placing the sacrificial mandrel in-between the first and second sheets comprises one or more actions selected from the group consisting of making and placing a patterned sheet of sacrificial material, depositing sacrificial material directly on to one or more of the sheets, stamping, and masking and etching.

6. The method of claim 5, wherein the step of making a patterned sheet of sacrificial material comprises performing one or more actions on a sheet of sacrificial material selected from the group consisting of laser cutting, blade cuffing, water-jet cutting, punching, and masking and etching.

7. The method of claim 5, wherein the step of depositing sacrificial material comprises performing one or more actions selected from the group consisting of direct-writing, direct micropen writing and spinning-on a photo-patternable liquid followed by masking and exposing and developing the pattern.

8. The method of claim 1, wherein the two sheets of deformable dielectric material comprise unfired ceramic green-tape; and further wherein removing the sacrificial mandrel in step d) comprises baking the laminated structure at a temperature and time sufficient to remove the sacrificial mandrel by burning out organic constituents in the sacrificial material; followed by firing the baked structure at a temperature sufficiently high to sinter and density it into a monolithic ceramic structure having an internal cavity.

9. The method of claim 8, wherein the unfired ceramic green-tape comprises LTCC green-tape material.

10. The method of claim 8, further comprising firing the baked structure in a vacuum.

11. The method of claim 1, wherein the second sheet deforms around the sacrificial mandrel during lamination in step c).

12. The method of claim 1, wherein the sacrificial mandrel comprises a sheet of sacrificial material having at least one edge extending out to the edge of one of the sheets of the deformable dielectric material, wherein the internal cavity formed in step d) has at least one opening connected to the outside environment.

13. The method of claim 1, wherein the laminated structure has a deformed outer surface comprising a protruded region located above the internal cavity.

14. The method of claim 1, wherein the second sheet is supported by a rigid surface during laminating in step c).

15. The method of claim 1, wherein the sacrificial mandrel comprises a geometric shape selected from the group consisting of a flat sheet, a curved sheet, a solid cylinder, a tube, a wire, a disk, a straight line, a curved line, a serpentine line, and a wet-deposited line on a substrate having a partially-flattened, spread-out, drop-like cross-sectional shape.

16. The method of claim 1, wherein the laminated structure comprises means for venting out gases evolved during removal of the sacrificial mandrel.

17. A method of fabricating a monolithic, ceramic body having an internal cavity, the method comprising:
   a) providing first and second sheets made of a deformable dielectric material, and providing a sacrificial mandrel made of a sacrificial material that does not comprise low melting point metal or metal alloy, Woods metal, or inorganic oxide ceramic powders greater than 3 micron diameter held in a polymer binder; then
   b) stacking the first sheet on top of the second sheet, with the sacrificial mandrel sandwiched in-between the first and second sheets, wherein the sacrificial mandrel is not inserted into a cutout made in any of the sheets; then
   c) forming a laminated structure by applying sufficient external pressure to the stack of sheets to adhere the first and second sheets together, while at the same time permanently deforming at least the first sheet around the sacrificial mandrel; and then
   d) removing the sacrificial mandrel by heating the laminated structure to a temperature sufficient to volatilize all of the sacrificial material, thereby creating an internal cavity bounded by the first and second sheets, with no spherical balls or discs disposed inside of the cavity; and then
   e) further heating the laminated structure to sinter and densify the laminated sheets of dielectric material into a monolithic, ceramic body;
   wherein the method further comprises depositing a thick-film coating on to the second sheet of deformable dielectric material, which is subsequently directly covered by the sacrificial mandrel before laminating in step c); wherein the thick-film coating becomes exposed to the environment inside of the internal cavity after the sacrificial material has been removed in step d); and further wherein the thick-film coating resides on one of the interior surfaces of the internal cavity, and does not touch the opposite interior surface of said cavity; and
   wherein the internal cavity does not have any openings to the outside environment.

18. The method of claim 17, wherein the thick-film coating comprises a non-cofireable material.

19. The method of claim 1, wherein the sacrificial mandrel comprises a sheet of the sacrificial material that is perforated with a plurality of holes.

20. The method of claim 19, wherein the diameter of the holes is sufficiently large so that the first and second sheets deform sufficiently far into each hole so that the two sheets make contact and adhere to each other during laminating in step c), thereby forming a support post at the location of the hole for providing structural support between the first and second sheets.

21. The method of claim 1, wherein the method further comprises providing two or more pieces of sacrificial material and stacking them on top of each other, with at least one layer of the deformable dielectric material disposed in-between each piece of sacrificial material, prior to laminating in step c).

22. The method of claim 1, wherein during laminating in step c) the stack of sheets is uniaxially pressed between a pair of rigid anvils, so that the upper and lower outer surfaces of the stack remains flat during laminating.

23. The method of claim 1, further comprising, before step c), fabricating at least one via in a sheet of the deformable dielectric material, wherein the via is connected to the internal cavity.

24. The method of claim 1, wherein the internal cavity does not have any openings to the outside environment.

25. The method of claim 1, wherein the internal cavity has at least one opening to the outside environment.

26. The method of claim 1, wherein the first sheet of deformable dielectric material completely closes around the sacrificial mandrel during laminating in step c), leaving no gaps around the edges of the sacrificial mandrel.

27. The method of claim 1,
   wherein the sacrificial mandrel further comprises a second thick-film deposit of material deposited on a second side of the sheet of sacrificial material prior to being laminated in step c); and
   wherein after further heating in step e) to sinter and densify the dielectric sheets into a monolithic ceramic body, the second thick-film deposit resides on a second interior surface of the internal cavity and does not touch the opposing, first interior surface of the cavity opposite from the second interior surface.

28. The method of claim 1, wherein the thickness of the sacrificial mandrel is different than the thickness of the first or second sheets.

29. The method of claim 1, wherein the thick-film deposit is an electrically conductive metallized paste or ink; and wherein after heating in step e) the thick-film deposit has become an electrically-conducting electrode, line, or trace.

30. The method of claim 17, wherein the thick-film coating is an electrically conductive metallized paste or ink; and wherein after heating in step e) the thick-film coating has become an electrically-conducting electrode, line, or trace.

31. The method of claim 1, wherein the sacrificial material is wider than the thick-film deposit.

32. The method of claim 17, wherein the sacrificial material is wider than the thick-film deposit.

* * * * *